United States Patent
Yang et al.

(10) Patent No.: US 12,284,873 B2
(45) Date of Patent: Apr. 22, 2025

(54) DISPLAY PANEL AND DISPLAY DEVICE

(71) Applicant: Xiamen Tianma Display Technology Co., Ltd., Xiamen (CN)

(72) Inventors: Jinjin Yang, Xiamen (CN); Qingjun Lai, Xiamen (CN); Yihua Zhu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 296 days.

(21) Appl. No.: 17/646,626

(22) Filed: Dec. 30, 2021

(65) Prior Publication Data

US 2023/0080838 A1    Mar. 16, 2023

(30) Foreign Application Priority Data

Sep. 14, 2021   (CN) .......................... 202111075596.8

(51) Int. Cl.
| | |
|---|---|
| *H01L 27/12* | (2006.01) |
| *H10K 59/121* | (2023.01) |
| *H10K 59/131* | (2023.01) |
| *H01L 29/786* | (2006.01) |

(52) U.S. Cl.
CPC ....... *H10K 59/1213* (2023.02); *H10K 59/131* (2023.02); *H01L 27/1225* (2013.01); *H01L 27/124* (2013.01); *H01L 29/78675* (2013.01); *H01L 29/7869* (2013.01)

(58) Field of Classification Search
CPC .............. H10K 59/1213; H10K 59/131; H01L 27/1225; H01L 27/124; H01L 29/78675; H01L 29/7869

USPC ......................................................... 257/76
See application file for complete search history.

(56) References Cited

U.S. PATENT DOCUMENTS

| | | | |
|---|---|---|---|
| 2004/0263222 A1* | 12/2004 | Tseng ................... | H03K 17/145 327/143 |
| 2008/0158110 A1* | 7/2008 | Iida ...................... | G09G 3/3266 345/76 |
| 2018/0006099 A1* | 1/2018 | Ka ..................... | H10K 59/1213 |

FOREIGN PATENT DOCUMENTS

| | | |
|---|---|---|
| CN | 104517972 A | 4/2015 |
| CN | 105070740 A | 11/2015 |
| CN | 111668263 A | 9/2020 |

* cited by examiner

*Primary Examiner* — Ori Nadav
(74) *Attorney, Agent, or Firm* — Anova Law Group, PLLC

(57) ABSTRACT

Display panel and display device are provided. The display panel includes a pixel circuit and a light-emitting element. The pixel circuit includes a driving transistor and an initialization transistor. The initialization transistor is configured to provide an initialization signal for a preset node. The preset node is a gate of the driving transistor, or an anode of the light-emitting element. The pixel circuit includes an oxide semiconductor transistor and a silicon transistor. An active layer of the oxide semiconductor transistor includes an oxide semiconductor, and an active layer of the silicon transistor includes silicon. The pixel circuit includes a first pixel circuit and a second pixel circuit. The first pixel circuit includes a first initialization transistor. The second pixel circuit includes a second initialization transistor. An active layer of the first initialization transistor is connected to an active layer of the second initialization transistor through a first connection wire.

19 Claims, 22 Drawing Sheets

DISPLAY PANEL AND DISPLAY DEVICE

CROSS-REFERENCE TO RELATED APPLICATION

This application claims priority of Chinese Patent Application No. 202111075596.8, filed on Sep. 14, 2021, the entire content of which is hereby incorporated by reference.

FIELD OF THE DISCLOSURE

The present disclosure generally relates to the field of display technology and, more particularly, relates to a display panel and a display device.

BACKGROUND

A frame area of an existing display device may include a peripheral driving circuit for providing driving signals to pixel units in the display area. In the display device, a plurality of pixel units may be disposed in a display area, and each pixel unit may include a pixel circuit. Each pixel circuit may be electrically connected to the peripheral driving circuit at the frame area. The peripheral driving circuit may provide scanning control signals and light-emitting control signals to the pixel circuits for controlling the pixel circuits to provide driving current for light-emitting elements.

The pixel circuit may also include an initialization transistor. To initialize the pixel circuit, an initialization signal needs to be applied to the initialization transistor, and the initialization transistor may selectively transmit the initialization signal to a preset node in the pixel circuit. Accordingly, a separate signal line may need to be disposed in the display device to apply the initialization signal to the initialization transistor. In an existing display device, the initialization signal is generally provided by an integrated chip (IC). Due to voltage drop along a signal line, inconsistency between the initialization signal near an IC terminal and the initialization signal far away from the IC terminal may appear.

SUMMARY

One aspect of the present disclosure includes a display panel. The display panel includes a pixel circuit and a light-emitting element. The pixel circuit includes a driving transistor and an initialization transistor. The initialization transistor is configured to provide an initialization signal for a preset node, and the preset node is a gate of the driving transistor, or an anode of the light-emitting element. The pixel circuit includes an oxide semiconductor transistor and a silicon transistor. An active layer of the oxide semiconductor transistor includes an oxide semiconductor, and an active layer of the silicon transistor includes silicon. The pixel circuit includes a first pixel circuit and a second pixel circuit. The first pixel circuit includes a first initialization transistor, and the second pixel circuit includes a second initialization transistor. An active layer of the first initialization transistor is connected to an active layer of the second initialization transistor through a first connection wire, and at least a portion of an area of the first connection wire and the active layer of the oxide semiconductor transistor are located on a same layer.

Another aspect of the present disclosure includes a display device. The display device includes a display panel. The display panel includes a pixel circuit and a light-emitting element. The pixel circuit includes a driving transistor and an initialization transistor. The initialization transistor is configured to provide an initialization signal for a preset node, and the preset node is a gate of the driving transistor, or an anode of the light-emitting element. The pixel circuit includes an oxide semiconductor transistor and a silicon transistor. An active layer of the oxide semiconductor transistor includes an oxide semiconductor, and an active layer of the silicon transistor includes silicon. The pixel circuit includes a first pixel circuit and a second pixel circuit. The first pixel circuit includes a first initialization transistor, and the second pixel circuit includes a second initialization transistor. An active layer of the first initialization transistor is connected to an active layer of the second initialization transistor through a first connection wire, and at least a portion of an area of the first connection wire and the active layer of the oxide semiconductor transistor are located on a same layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

In an existing display panel, a pixel circuit may include an initialization transistor. To initialize the pixel circuit, an initialization signal needs to be applied to the initialization transistor, and the initialization transistor may selectively transmit the initialization signal to a preset node in the pixel circuit. Accordingly, a separate signal line may need to be disposed in the display device to apply the initialization signal to the initialization transistor. In an existing display device, the initialization signal is generally provided by an integrated chip (IC). Due to voltage drop along a signal line, inconsistency between the initialization signal near an IC terminal and the initialization signal far away from the IC terminal may appear.

The present disclosure provides a display panel and a display device. With technical solutions of the present disclosure, technical problems in existing technology may be addressed, and consistency of initialization signals connected to the initialization transistors at different regions of the display panel may be improved.

Figure 1:
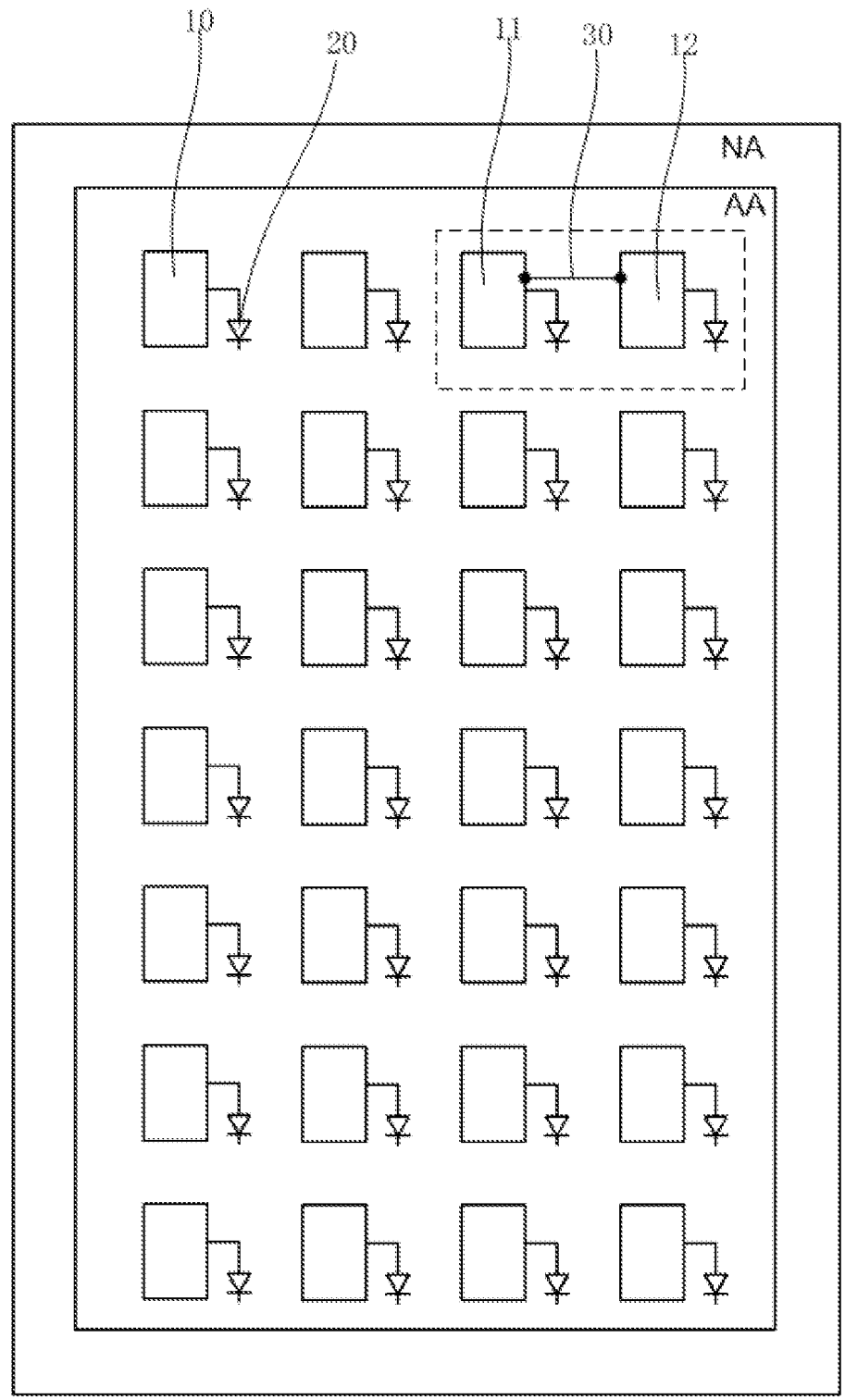
FIG. 1 illustrates a schematic structural diagram of a display panel consistent with the disclosed embodiments of the present disclosure.
Figure 2:
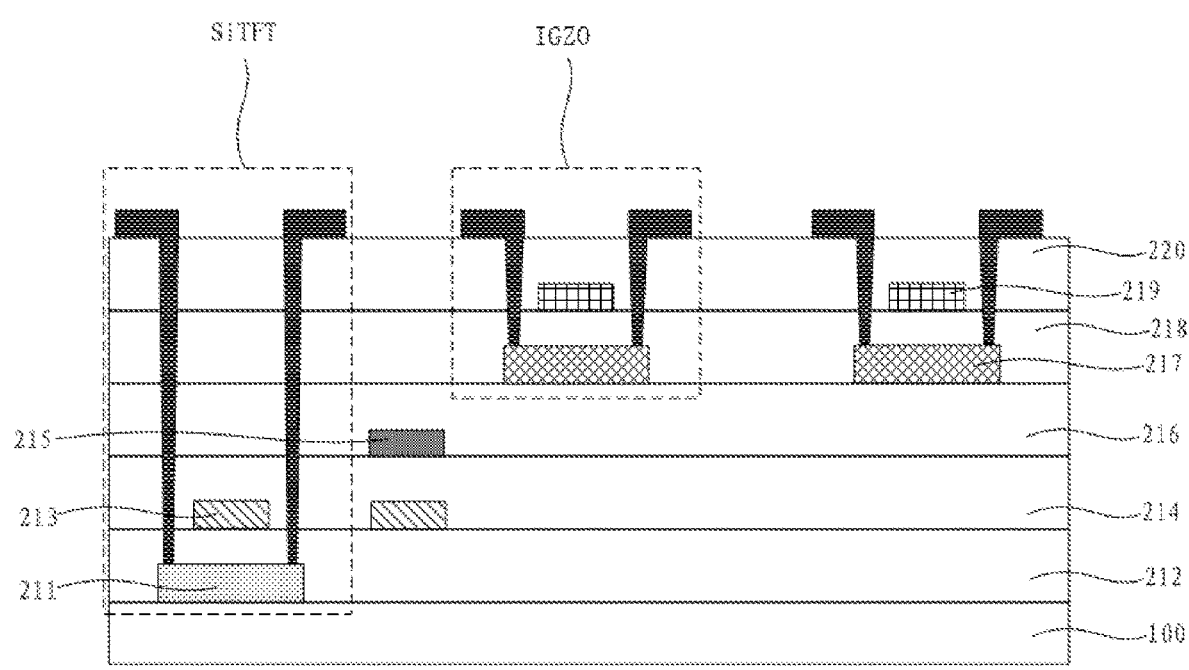
FIG. 2 illustrates a schematic structural diagram of another display panel consistent with the disclosed embodiments of the present disclosure.
Figure 3:
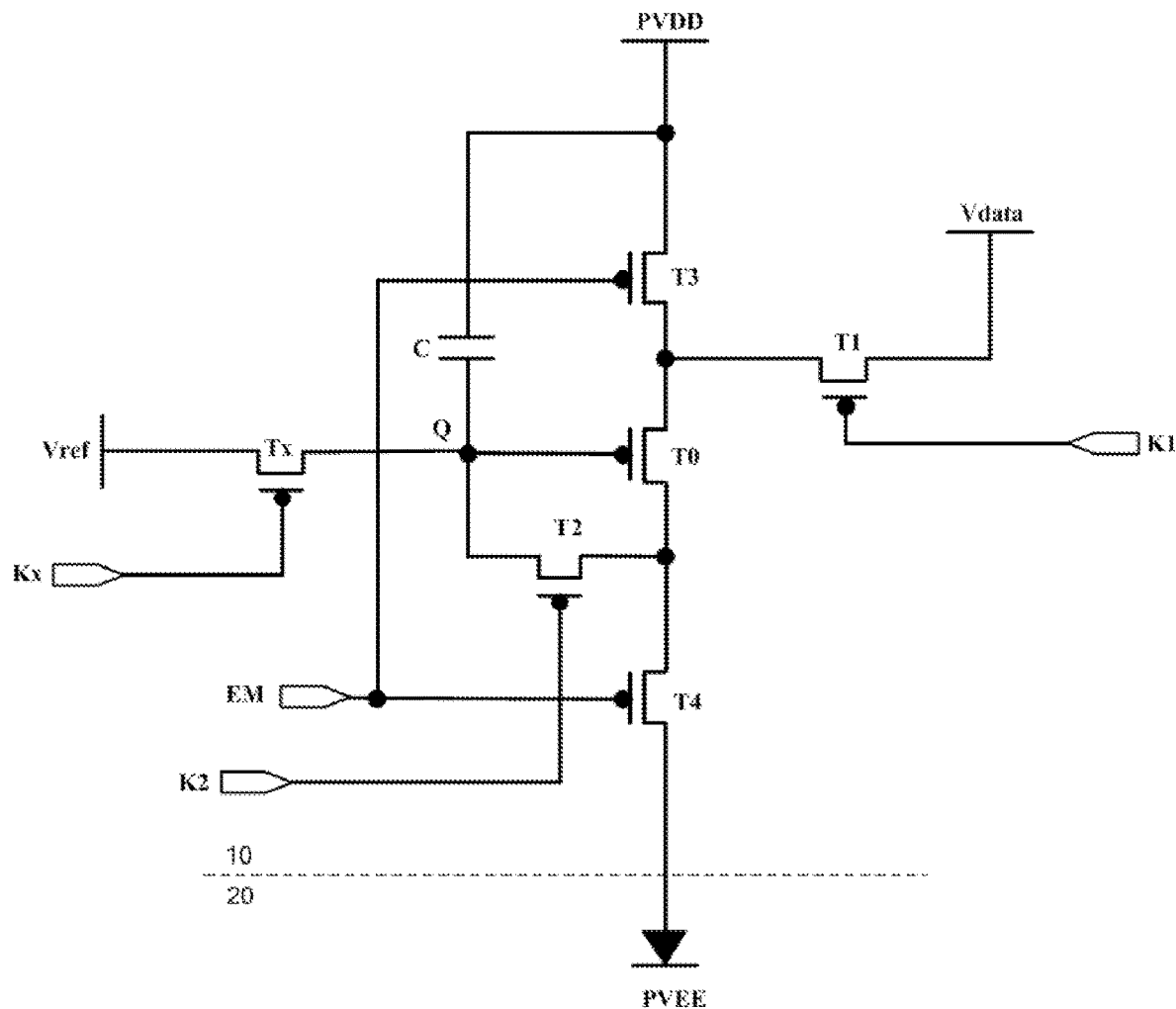
FIG. 3 illustrates a schematic structural diagram of a pixel circuit consistent with the disclosed embodiments of the present disclosure.
Figure 4:
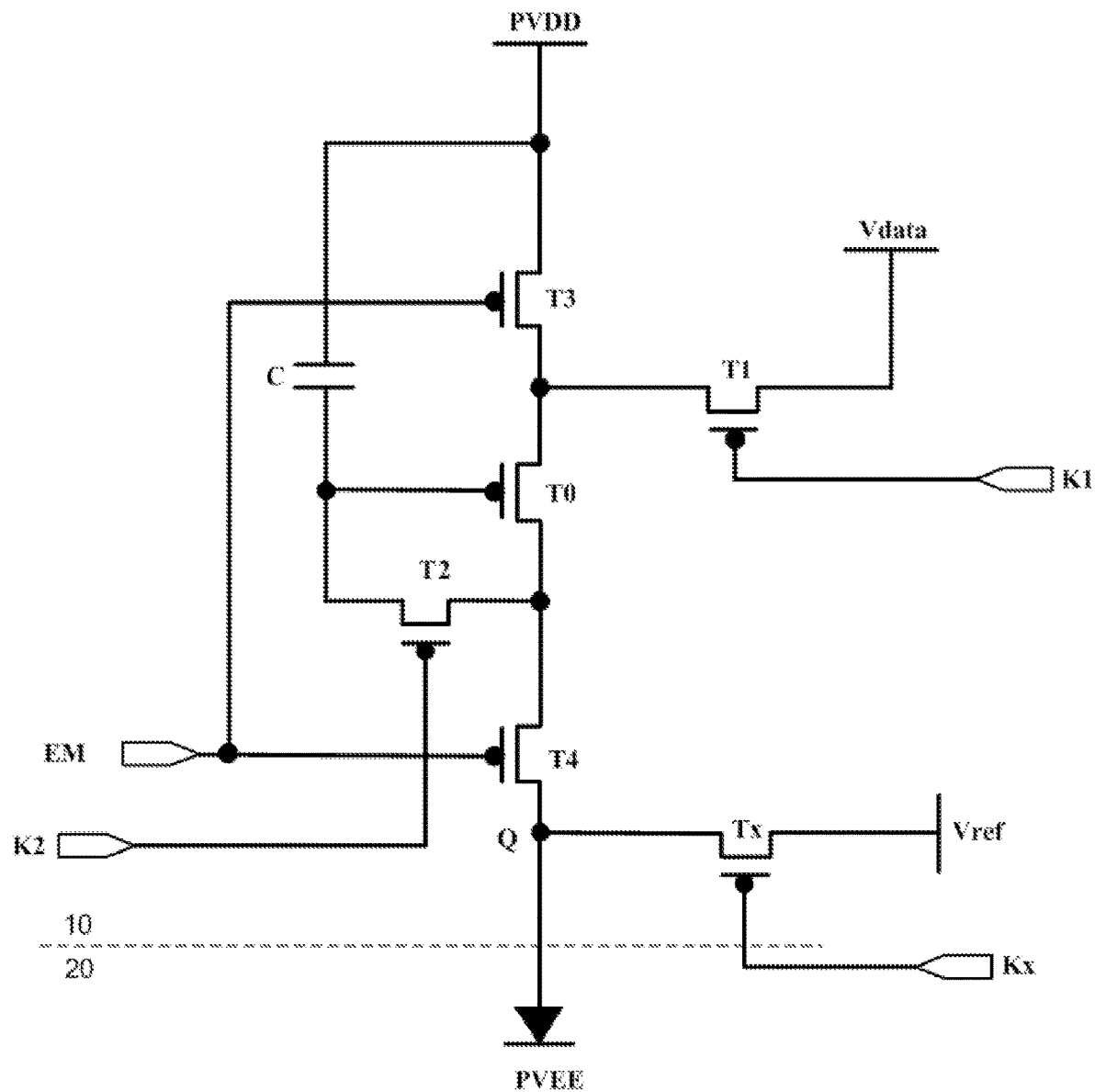
FIG. 4 illustrates a schematic structural diagram of another pixel circuit consistent with the disclosed embodiments of the present disclosure.

FIG. 1 illustrates a schematic structural diagram of a display panel consistent with the disclosed embodiments of the present disclosure. FIG. 2 illustrates a schematic structural diagram of another display panel consistent with the disclosed embodiments of the present disclosure. FIG. 3 illustrates a schematic structural diagram of a pixel circuit consistent with the disclosed embodiments of the present disclosure. FIG. 4 illustrates a schematic structural diagram of another pixel circuit consistent with the disclosed embodiments of the present disclosure. As shown in FIGS. 1-4, the display panel includes a display area AA and a frame area NA surrounding the display area AA. The display area AA includes a pixel circuit 10 and a light-emitting element 20.

The pixel circuit 10 includes a driving transistor T0 and an initialization transistor Tx. The initialization transistor Tx is configured to provide an initialization signal for a preset node Q. The preset node Q may be a gate of the driving transistor T0 (as shown in FIG. 3), or an anode of the light-emitting element 20 (as shown in FIG. 4).

The pixel circuit 10 may include an oxide semiconductor transistor IGZO and a silicon transistor SiTFT. An active layer of the oxide semiconductor transistor IGZO may include an oxide semiconductor. An active layer of the silicon transistor SiTFT may include silicon.

As shown in FIG. 2, the display panel includes a base substrate 100 and a silicon semiconductor layer 211 located on the base substrate 100. The silicon semiconductor layer 211 includes an active layer of silicon transistor SiTFT. The display panel also includes a first insulating layer 212 on a side of the silicon semiconductor layer 211 away from the base substrate 100, and a first gate metal layer 213 on a side of the first insulating layer 212 away from the base substrate 100. The first gate metal layer 213 includes a gate of the silicon transistor SiTFT. The display panel also includes a second insulating layer 214 on a side of the first gate metal layer 213 away from the base substrate 100, and a capacitive metal layer 215 on a side of the second insulating layer 214 away from the base substrate 100. The capacitive metal layer 215 includes a plate of a storage capacitor C, and another plate of the storage capacitor C may be made from the first gate metal layer 213 or other conductive layer systems. The display panel also includes a third insulating layer 216 located on a side of the capacitor metal layer 215 away from the base substrate 100, and an oxide semiconductor layer 217 located on a side of the third insulating layer 216 away from the base substrate 100. The oxide semiconductor layer 217 includes an active layer of the oxide semiconductor transistor IGZO. The display panel also includes a fourth insulating layer 218 located on a side of the oxide semiconductor layer 217 away from the base substrate 100, and a second gate metal layer 219 located on a side of the fourth insulating layer 218 away from the base substrate 100. The second gate metal layer 219 includes a gate of the oxide semiconductor transistor IGZO. The display panel also includes a fifth insulating layer 220 on a side of the second gate metal layer 219 away from the base substrate 100, and a source/drain metal layer 221 located on a side of the fifth insulating layer 220 away from the base substrate 100. The source/drain metal layer 221 includes a source and a drain of the oxide semiconductor transistor IGZO, and a source and a drain of the silicon transistor SiTFT.

The pixel circuit 10 includes a first pixel circuit 11 and a second pixel circuit 12. The first pixel circuit 11 includes a first initialization transistor. The second pixel circuit 12 includes a second initialization transistor. An active layer of the first initialization transistor is connected to an active layer of the second initialization transistor through a first connection wire 30. At least a portion of an area of the first connection wire 30 and the active layer of the oxide semiconductor transistor are located in a same layer.

It is understandable that, in the present disclosure, the active layer of the first initialization transistor of the first pixel circuit is connected to the active layer of the second initialization transistor of the second pixel circuit through the first connection wire, such that the active layers of the initialization transistors in different areas are connected. Thus, after one of the initialization transistors is connected to an initialization signal, the initialization signal may be transmitted to another initialization transistor through the first connection wire. Accordingly, large differences in the initialization signals of the initialization transistors in different regions, when the initialization signals are only transmitted through the signal lines with voltage drops, may be avoided. As such, uniformity of the initialization signals connected to the initialization transistors in different areas of the display panel may be improved.

In addition, by connecting the active layer of the first initialization transistor to the active layer of the second initialization transistor through the first connection wire, a quantity of the signal lines for transmitting the initialization signals may be reduced. Accordingly, a line density of the display panel may be reduced, and thus a purpose of resolution improvement may be achieved. Further, when one of the signal lines for transmitting the initialization signals is disconnected, the initialization signals may be transmitted to the connected initialization transistors through the first connection wire. Accordingly, circuit flexibility and reliability may be improved.

Moreover, in the present disclosure, at least a portion of the area of the first connection wire and the active layer of the oxide semiconductor transistor are located on a same layer. By adjusting the electrical conductivity of the first connection wire, the first connection wire may be used as a wire for connecting two active layers, and a conductive film for making the first connection wire may not need to be separately prepared. Accordingly, a process flow for preparing the display panel may be simplified, and complexity of wiring layouts of other conductive film layers may be decreased.

In one embodiment, as shown in FIG. 3 or FIG. 4, the pixel circuit 10 includes a first transistor T1, a second transistor T2, a third transistor T3, a fourth transistor T4, a driving transistor T0, an initialization transistor Tx, and a holding capacitor C. The driving transistor T0 is configured to provide a driving current for the light-emitting element 20. The initialization transistor Tx is configured to perform initialization reset to the pixel circuit 10. A first electrode of the first transistor T1 is connected to a data signal Vdata, a second electrode of the first transistor T1 is connected to a first electrode of the driving transistor T0, and a gate of the first transistor T1 is connected to a first scan signal K1. A first electrode of the second transistor T2 is connected to the second electrode of the driving transistor T0, a second electrode of the second transistor T2 is connected to the gate of the driving transistor T0, and a gate of the second transistor T2 is connected to a second scan signal K2. Gates of the third transistor T3 and the fourth transistor T4 are connected to a light emission control signal EM. A first electrode of the third transistor T3 is connected to a first power signal PVDD, and a second electrode of the third transistor T3 is connected to a source of the driving transistor T0. A first electrode of the fourth transistor T4 is connected to a drain of the driving transistor T0, a second electrode of the fourth transistor T4 is connected to one end of the light-emitting element 20, and another end of the light-emitting element 20 is connected to a second power signal PVEE. The light-emitting control signal EM is a pulse signal. The light-emitting control signal EM controls the third transistor T3 and the fourth transistor T4 to be turned on during an effective pulse, and the light-emitting element 20 is in a light-emitting stage. The light-emitting control signal EM controls the third transistor T3 and the fourth transistor T4 to be turned off during an ineffective pulse, and the light-emitting element 20 is in a non-light-emitting stage. The holding capacitor C is configured to maintain potential of the preset node Q. A first end of the holding capacitor C is connected to the first power signal PVDD, and a second end of the holding capacitor C is connected to the gate of the driving transistor T0.

As shown in FIG. 3, in one embodiment, the gate of the initialization transistor Tx is connected to the initialization control signal Kx, the first electrode of the initialization transistor Tx is connected to an initialization signal Vref, and the second electrode of the initialization transistor Tx is electrically connected to the gate of the driving transistor T0. The preset node Q is the gate of the driving transistor T0.

A working process of the pixel circuit 10 includes an initialization stage, a data writing stage, and a light-emitting stage. In the initialization stage, the initialization transistor Tx transmits the initialization signal Vref to the gate of the driving transistor T0 to perform initialization reset on the driving transistor T0, and the transistors T1 to T4 are in an off state. Then in the data writing stage, the first transistor T1 and the second transistor T2 are turned on. The first transistor T1 transmits the data signal Vdata to the first electrode of the driving transistor T0. The second transistor T2 connects the gate of the driving transistor T0 with the second electrode of the driving transistor T0. The initialization transistor Tx, the third transistor T3 and the fourth transistor T4 are in an off state. Finally, in the light-emitting stage, the third transistor T3 and the fourth transistor T4 are turned on. Accordingly, a path of the driving current generated by the driving transistor T0 to the light-emitting element 20 and turned on, driving the light-emitting element 20 to emit light. The light-emitting element 20 may be a light-emitting diode.

As shown in FIG. 4, in one embodiment, the gate of the initialization transistor Tx is connected to the initialization control signal Kx, the first electrode of the initialization transistor Tx is connected to the initialization signal Vref, and he second electrode of the initialization transistor Tx is electrically connected to the anode of the light-emitting element 20. The preset node Q is the anode of the light-emitting element 20.

A working process of the pixel circuit 10 includes an initialization stage, a data writing stage, and a light-emitting stage. In the initialization stage, the initialization transistor Tx transmits the initialization signal Vref to the anode of the light-emitting element 20 to perform initialization reset on the pixel circuit 10, and the transistors T1 to T4 are in an off state. Then in the data writing stage, the first transistor T1 and the second transistor T2 are turned on. The first transistor T1 transmits the data signal Vdata to the first electrode of the driving transistor T0. The second transistor T2 connects the gate of the driving transistor T0 with the second electrode of the driving transistor T0. The initialization transistor Tx, the third transistor T3 and the fourth transistor T4 are in an off state. Finally, in the light-emitting stage, the third transistor T3 and the fourth transistor T4 are turned on. Accordingly, a path of the driving current generated by the driving transistor T0 to the light-emitting element 20 and turned on, driving the light-emitting element 20 to emit light. The light-emitting element 20 may be a light-emitting diode.

It should be noted that, in the present disclosure, the pixel circuit is not limited to the two circuits shown in FIG. 3 and FIG. 4, and may have other circuit structures. The pixel circuit may be specifically selected according to an actual application.

In the present disclosure, the initialization transistor may be an oxide semiconductor transistor. In one embodiment, each of the first connection wire and the active layer of the initialization transistor includes an oxide semiconductor. In addition, the electrical conductivity of the first connection wire may be greater than the electrical conductivity of a channel region of the active layer of the initialization transistor.

Figure 5:
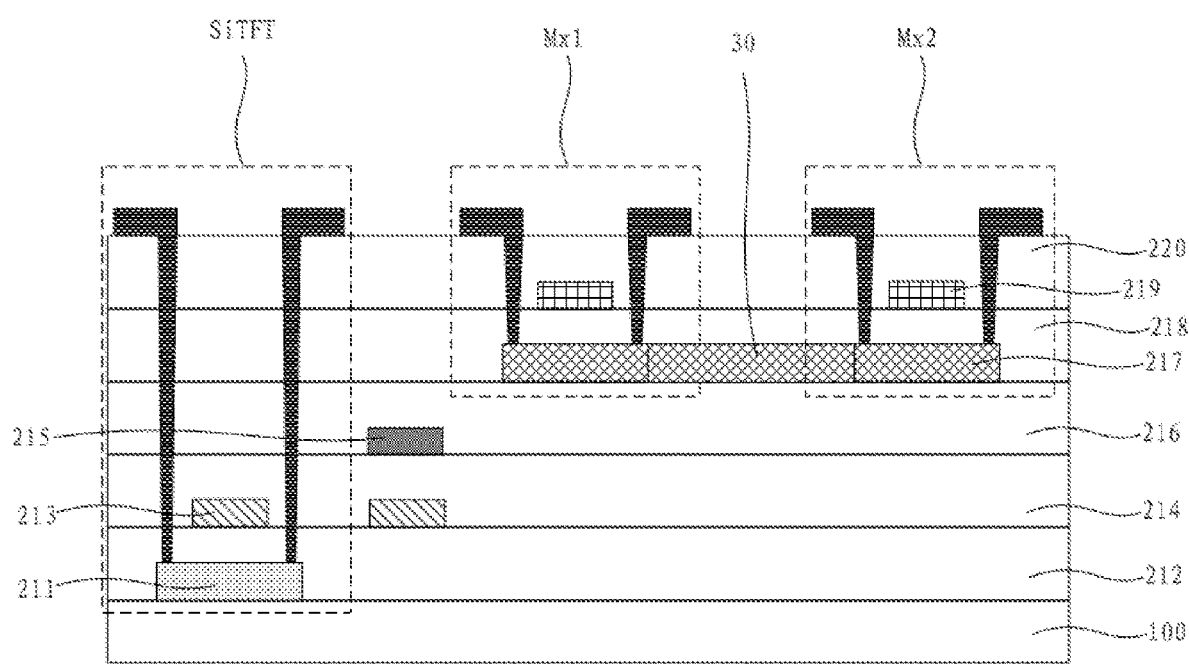
FIG. 5 illustrates a schematic structural diagram of another display panel consistent with the disclosed embodiments of the present disclosure.

FIG. 5 illustrates a schematic structural diagram of another display panel consistent with the disclosed embodiments of the present disclosure. As shown in FIG. 5, a first initialization transistor Mx1 and a second initialization transistor Mx2 are each an oxide semiconductor transistor. An active layer of the first initialization transistor Mx1 and an active layer of the second initialization transistor Mx2 are connected through a first connection wire 30. The first connection wire 30 and the active layers of the oxide semiconductor transistors are located on a same layer. In addition, the electrical conductivity of the first connection wire 30 may be adjusted and controlled when preparing the first connection wire 30, such that the electrical conductivity of the first connection wire 30 may be greater than the electrical conductivity of the channel region of the active layer of the initialization transistor. Accordingly, signal transmission performance of the first connection wire 30 may be improved.

Figure 6:
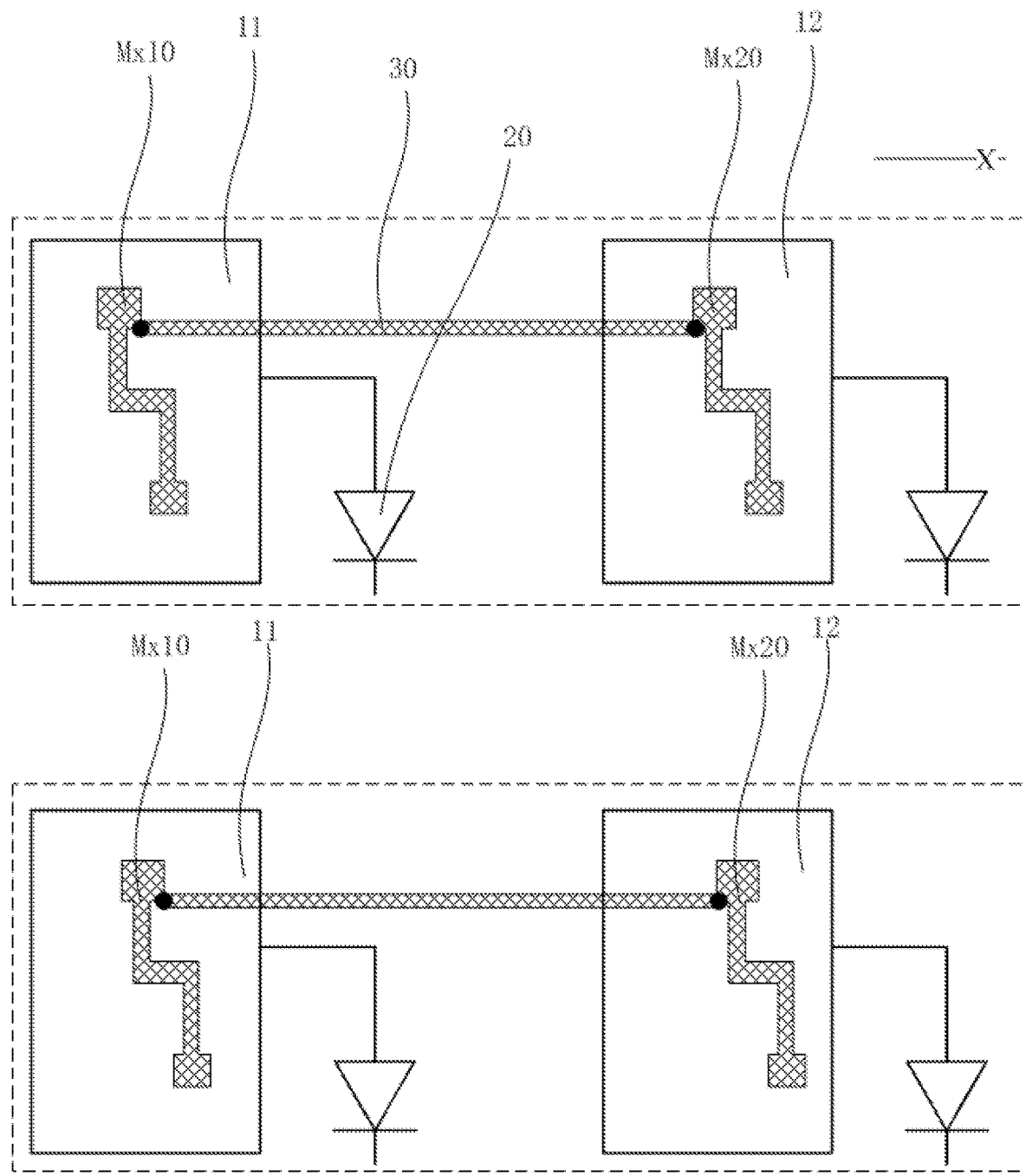
FIG. 6 illustrates a schematic structural diagram of another display panel consistent with the disclosed embodiments of the present disclosure.

FIG. 6 illustrates a schematic structural diagram of another display panel consistent with the disclosed embodiments of the present disclosure. As shown in FIG. 6, in one embodiment, the first pixel circuit 11 and the second pixel circuit 12 are arranged along a first direction X. The first connection wire 30 extends from the active layer Mx10 of the first initialization transistor along the first direction X to the active layer Mx20 of the second initialization transistor. The pixel circuits may be arranged in a multi-row*multi-column array. The first direction X may be an extension direction of a pixel circuit row (that is, an arrangement direction of multiple pixel circuit columns). When one of the first pixel circuit 11 and the second pixel circuit 12 is connected to a initialization signal, another pixel circuit also may receive the initialization signal, and thus a quantity of signal lines may be reduced. Further, when the active layers of the initialization transistors of the pixel circuits in a same row are each connected, when one of the initialization transistors receives the initialization signal, each pixel circuit in the row may receive the initialization signal. Accordingly, the quantity of the signal lines may be further reduced.

Figure 7:
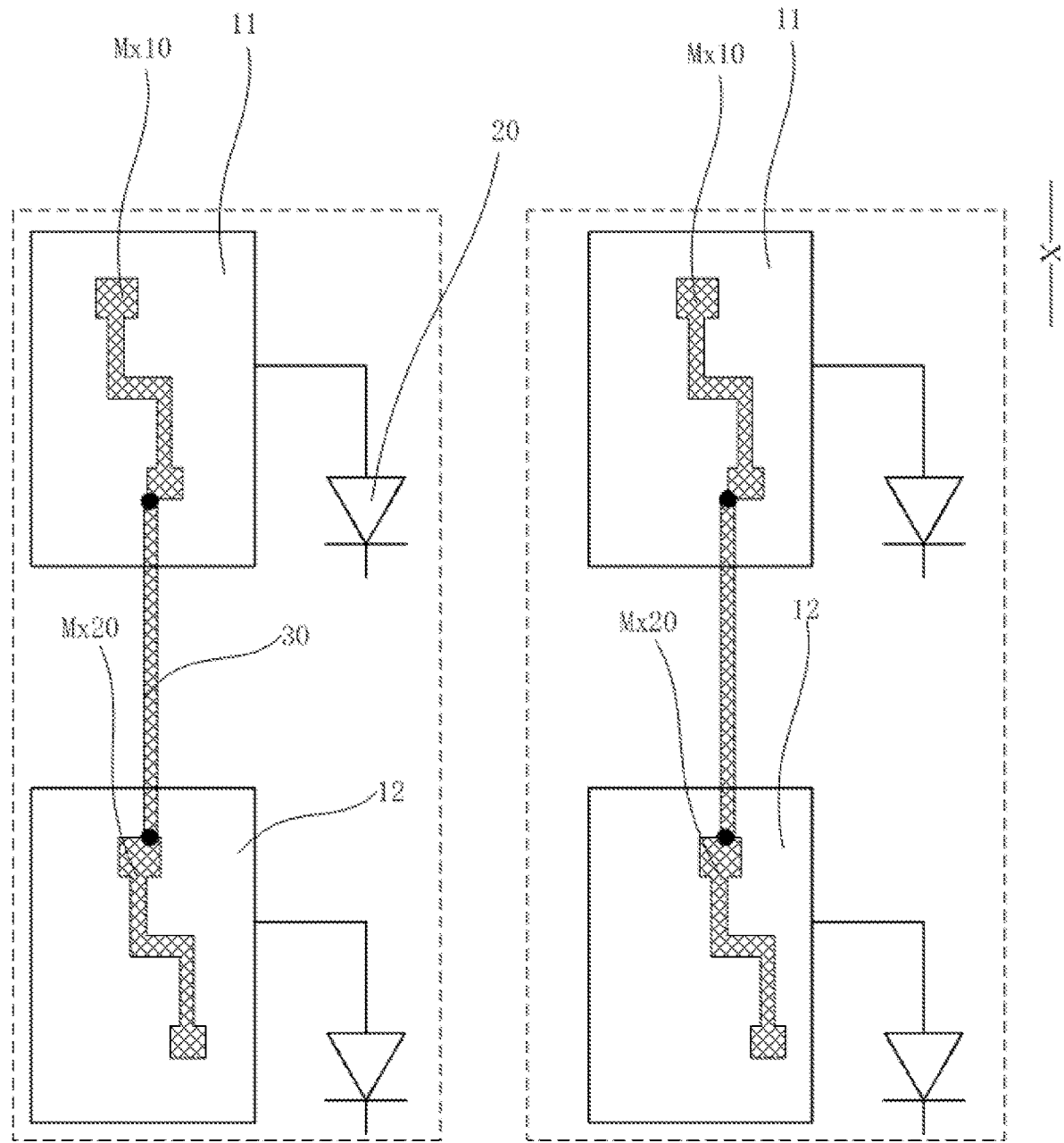
FIG. 7 illustrates a schematic structural diagram of another display panel consistent with the disclosed embodiments of the present disclosure.

Alternatively, the first direction may also be an extension direction of a pixel circuit column. FIG. 7 illustrates a schematic structural diagram of another display panel consistent with the disclosed embodiments of the present disclosure. As shown in FIG. 7, in one embodiment, the first pixel circuit 11 and the second pixel circuit 12 are arranged along a first direction X. The first connection wire 30 extends from the active layer Mx10 of the first initialization transistor along the first direction X to the active layer Mx20 of the second initialization transistor. The pixel circuits may be arranged in a multi-row*multi-column array. The first direction X may be an extension direction of a pixel circuit column (that is, an arrangement direction of multiple pixel circuit rows). When one of the first pixel circuit 11 and the second pixel circuit 12 is connected to an initialization signal, another pixel circuit may also receive the initialization signal, and thus a quantity of signal lines may be reduced. Further, when the active layers of the initialization transistors of the pixel circuits in a same column are each connected, when one of the initialization transistors receives the initialization signal, each pixel circuit in the column may receive the initialization signal. Accordingly, the quantity of the signal lines may be further reduced.

Figure 8:
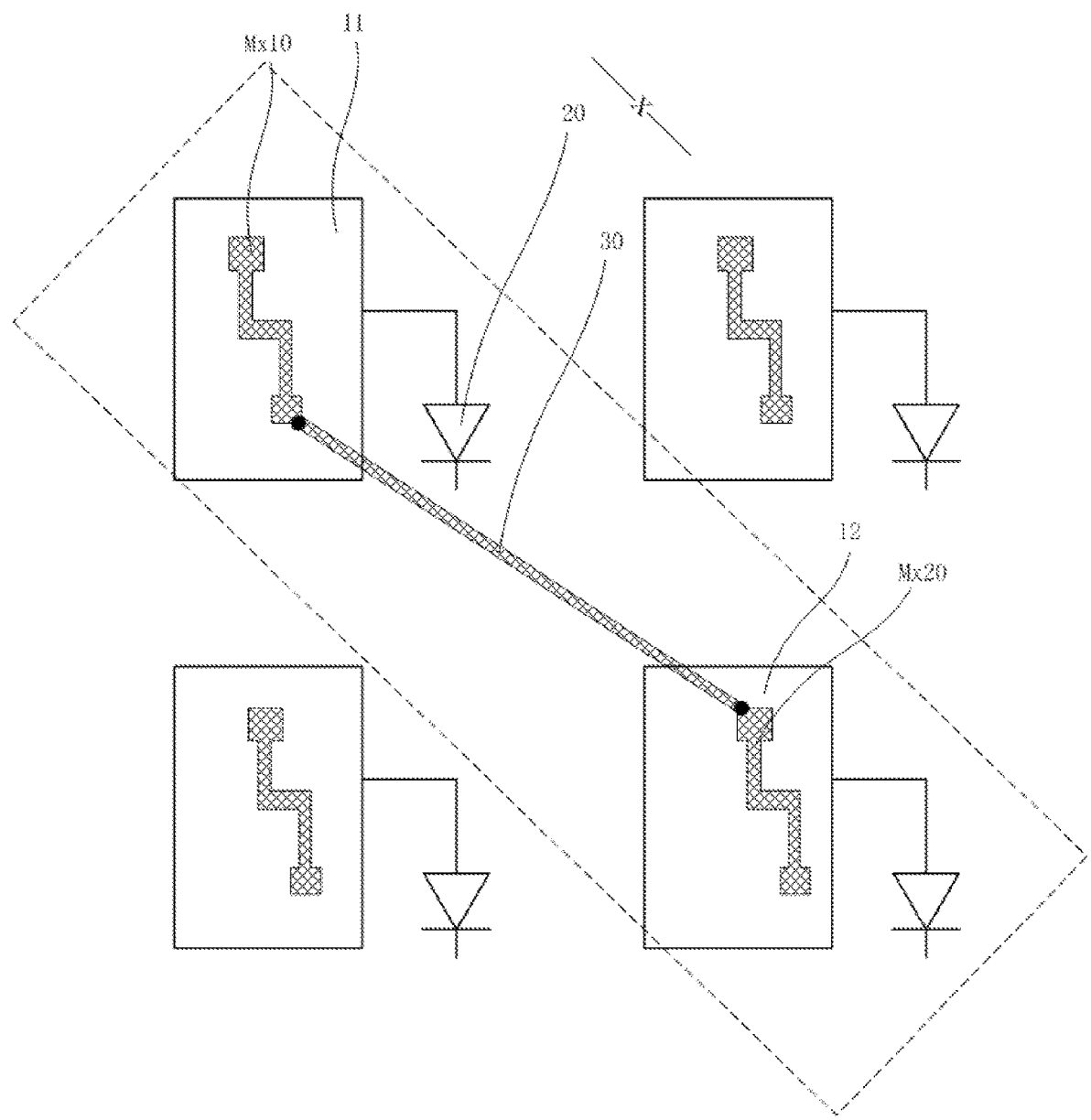
FIG. 8 illustrates a schematic structural diagram of another display panel consistent with the disclosed embodiments of the present disclosure.

Alternatively, the first direction may also be an oblique direction. FIG. 8 illustrates a schematic structural diagram of another display panel consistent with the disclosed embodiments of the present disclosure. As shown in FIG. 8, in one embodiment, the first pixel circuit 11 and the second pixel circuit 12 are arranged along a first direction X. The first connection wire 30 extends from the active layer Mx10 of the first initialization transistor along the first direction X to the active layer Mx20 of the second initialization transistor. The pixel circuits may be arranged in a multi-row*multi-column array. The first direction X may be an oblique direction that intersects the row direction or the column direction with an included angle less than 90 degrees. When one of the first pixel circuit 11 and the second pixel circuit 12 is connected to a initialization signal, another pixel circuit may also receive the initialization signal, and thus a quantity of signal lines may be reduced. Further, when the active layers of the initialization transistors of the pixel circuits in the first direction are each connected, when one of the initialization transistors receives the initialization signal, each of the pixel circuit connected may receive the initialization signal. Accordingly, the quantity of signal lines may be further reduced.

Figure 9:
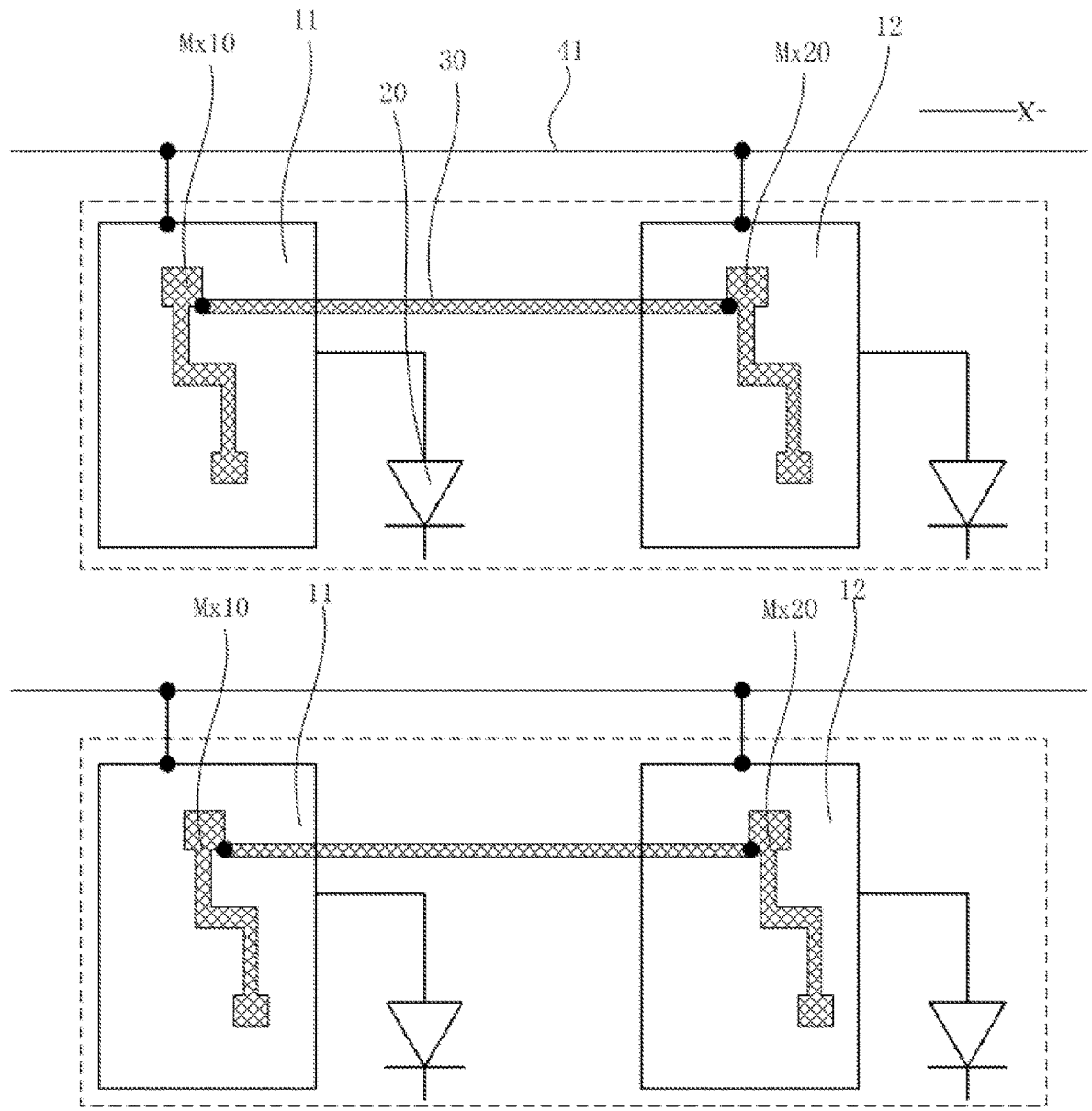
FIG. 9 illustrates a schematic structural diagram of another display panel consistent with the disclosed embodiments of the present disclosure.

FIG. 9 illustrates a schematic structural diagram of another display panel consistent with the disclosed embodiments of the present disclosure. As shown in FIG. 9, in one embodiment, the display panel includes a first signal line 41 extending along the first direction X. The first signal line 41 provides a control signal or an input signal for the pixel circuit 10. There is no overlap between the first signal line 41 and the first connection wire 30. Accordingly, parasitic capacitance between the first signal line 41 and the first connection wire 30 may be avoided, and thus signal transmission stability of the first signal line 41 and the first connection wire 30 may be improved.

It should be noted that, in one embodiment, the first signal line may transmit the control signal generated by the drive circuit of the display panel, such as the first control signal K1, the second control signal K2, the initialization control signal Kx, and the light emission control signal EM, which are connected to the pixel circuit 10 as shown in FIG. 3 and FIG. 4. In some other embodiments, the first signal line may transmit the input signal, such as the power signal, the initialization signal Vref, and the data signal Vdata, which are connected to the pixel circuit 10 as shown in FIG. 3 and FIG. 4.

Figure 10:
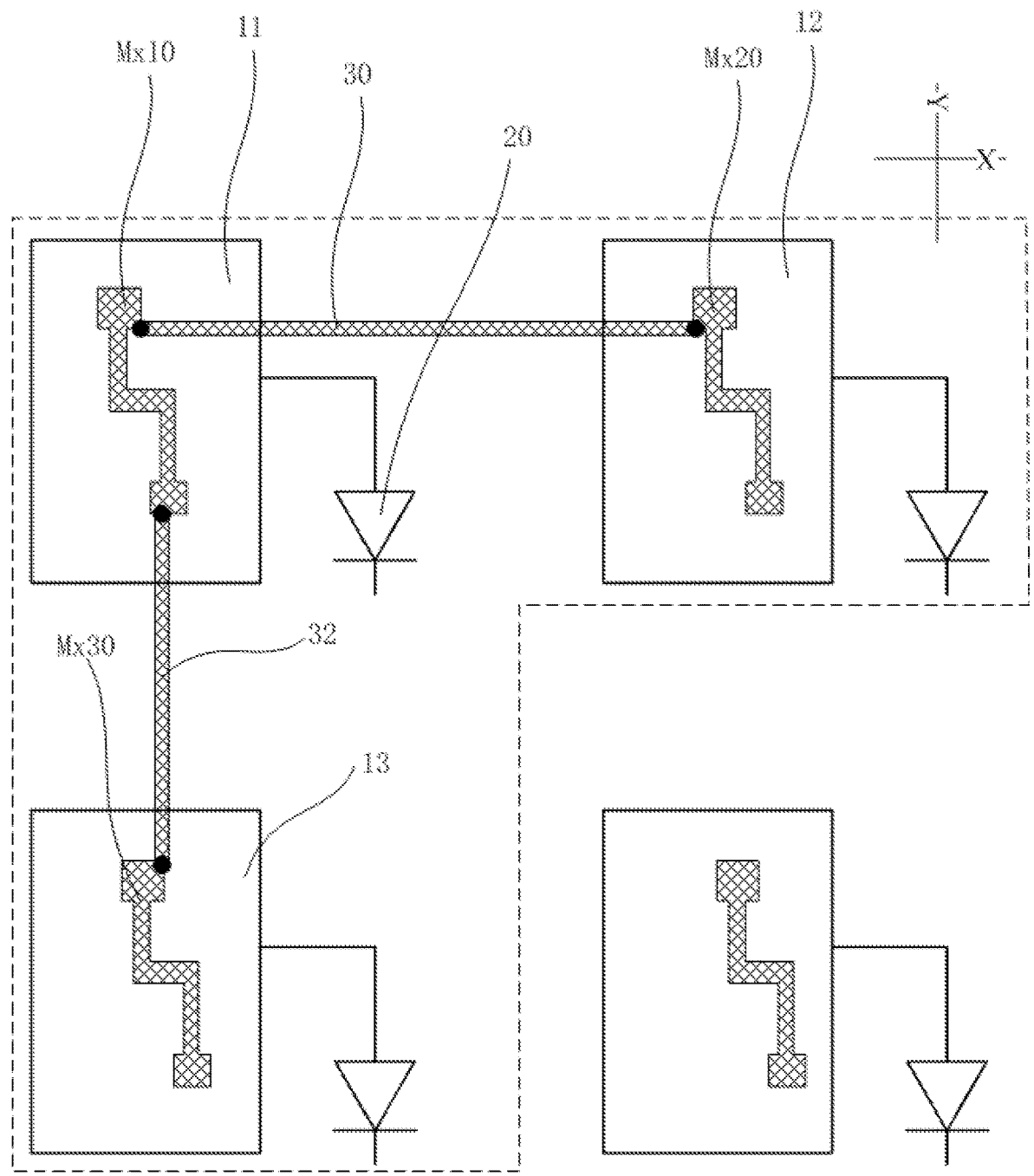
FIG. 10 illustrates a schematic structural diagram of another display panel consistent with the disclosed embodiments of the present disclosure.

In one embodiment, the display panel may not only connect the active layers of the initialization transistors of the pixel circuits in a same direction, but also connect the active layers of the initialization transistors of the pixel circuits in different directions. FIG. 10 illustrates a schematic structural diagram of another display panel consistent with the disclosed embodiments of the present disclosure. As shown in FIG. 10, the first pixel circuit 11 and the second pixel circuit 12 are arranged along the first direction X. The first connection wire 30 extends from the active layer Mx10 of the first initialization transistor along the first direction X to the active layer Mx20 of the second initialization transistor. The pixel circuits also include a third pixel circuit 13, and the third pixel circuit 13 includes a third initialization transistor. The first pixel circuit 11 and the third pixel circuit 13 are arranged along a second direction Y, and the first direction X intersects the second direction Y. The active layer Mx10 of the first initialization transistor and an active layer Mx30 of the third initialization transistor are connected by a second connection wire 32 extending in the second direction Y. Moreover, at least a portion of an area of the second connection wire 32 and the active layer of the initialization transistor are located on a same layer.

In the present disclosure, the pixel circuits may be arranged in a multi-row*multi-column array. The first direction X may be the extension direction of the pixel circuit row (that is, the arrangement direction of multiple pixel circuit columns), and the second direction Y may be the extension direction of the pixel circuit column. Accordingly, when one of the first pixel circuit 11, the second pixel circuit 12, and the third pixel circuit 13 receives the initialization signal, other two pixel circuits may also receive the initialization signal, and the quantity of the signal lines may thus be reduced. Further, when the active layers of the initialization transistors of the pixel circuits are each connected, when one of the pixel circuits receives the initialization signal, each of the pixel circuits may receive the initialization signal to transmit the initialization signal to the pixel circuits of the entire display panel. As such, the quantity of the signal lines may be further reduced.

Figure 11:
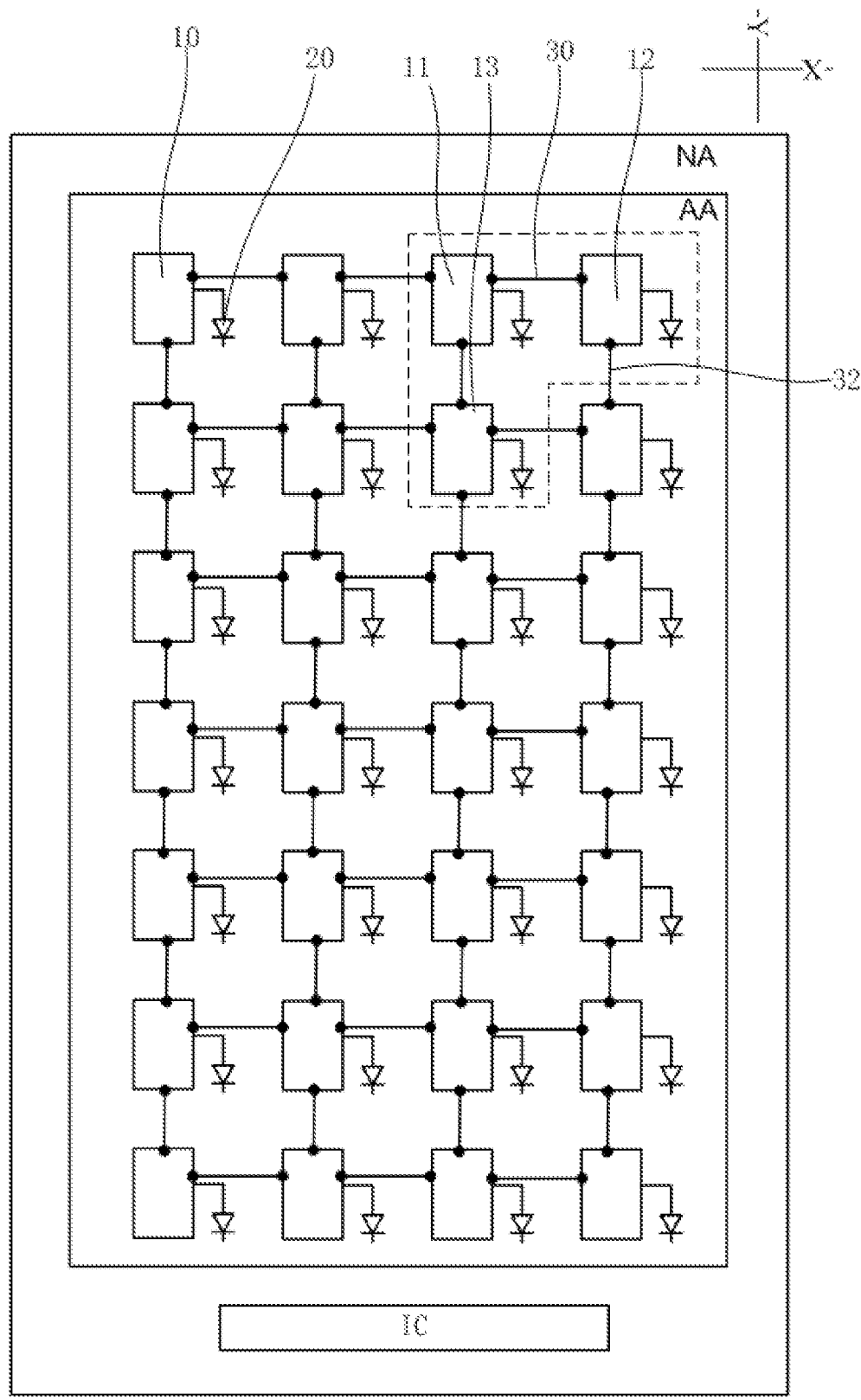
FIG. 11 illustrates a schematic structural diagram of another display panel consistent with the disclosed embodiments of the present disclosure.

FIG. 11 illustrates a schematic structural diagram of another display panel consistent with the disclosed embodiments of the present disclosure. As shown in FIG. 11, in one embodiment, the display panel includes an integrated chip IC. The integrated chip IC is located on a side frame arranged along the second direction Y of the display area AA of the display panel. The integrated chip IC may provide the initialization signal for the pixel circuit 10. A width of the second connection wire 32 is greater than a width of the first connection wire 30. Since an extension direction of the second connection wire 32 is same as the second direction Y, the second connection wire 32 includes a near IC end and a far IC end. Furthermore, since the width of the second connection wire 32 is made to be larger than the width of the first connection wire 30, the impedance of the second connection wire 32 may be small, and thus the voltage drop on the second connection wire 32 may be small. Accordingly, consistency of signal transmission on the second connection wire 32 may be improved. In addition, narrowing the line width of the first connection wire 30 may reduce the line occupation area, and thus high resolution of the display panel may be achieved.

Figure 12:
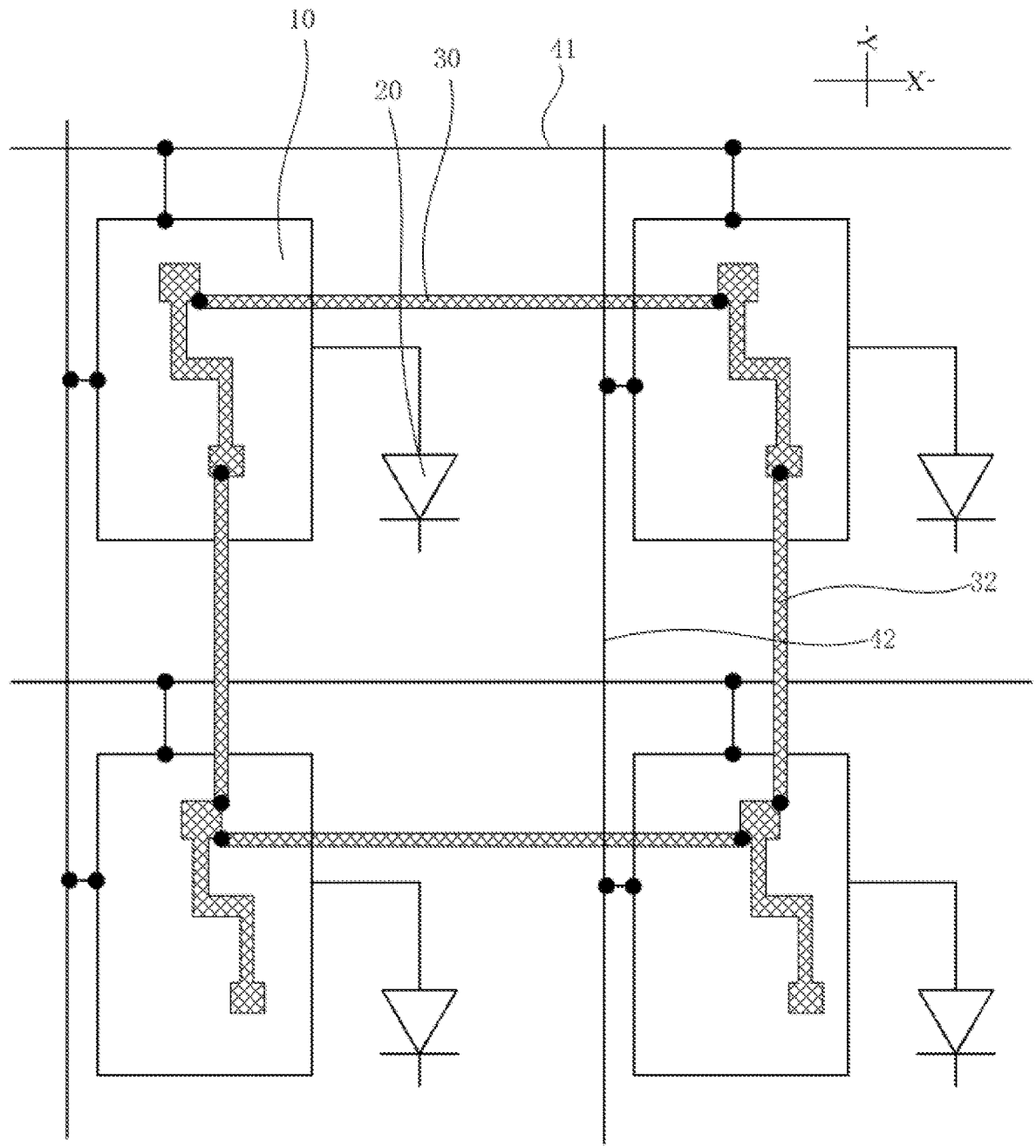
FIG. 12 illustrates a schematic structural diagram of another display panel consistent with the disclosed embodiments of the present disclosure.

FIG. 12 illustrates a schematic structural diagram of another display panel consistent with the disclosed embodiments of the present disclosure. As shown in FIG. 12, in one embodiment, the display panel includes a second signal line 42 extending along the second direction Y. The second signal line 42 provides a control signal or an input signal for the pixel circuit 10. There is no overlap between the second connection wire 32 and the second signal line 42. Accordingly, the parasitic capacitance between the second signal line 42 and the second connection wire 32 may be avoided, and thus high stability of signal transmission of the second signal line 42 and the second connection wire 32 may be achieved. Signals transmitted by the first signal line and the second signal line may be specifically selected according to actual applications, and are not limited by the present disclosure.

Figure 13:
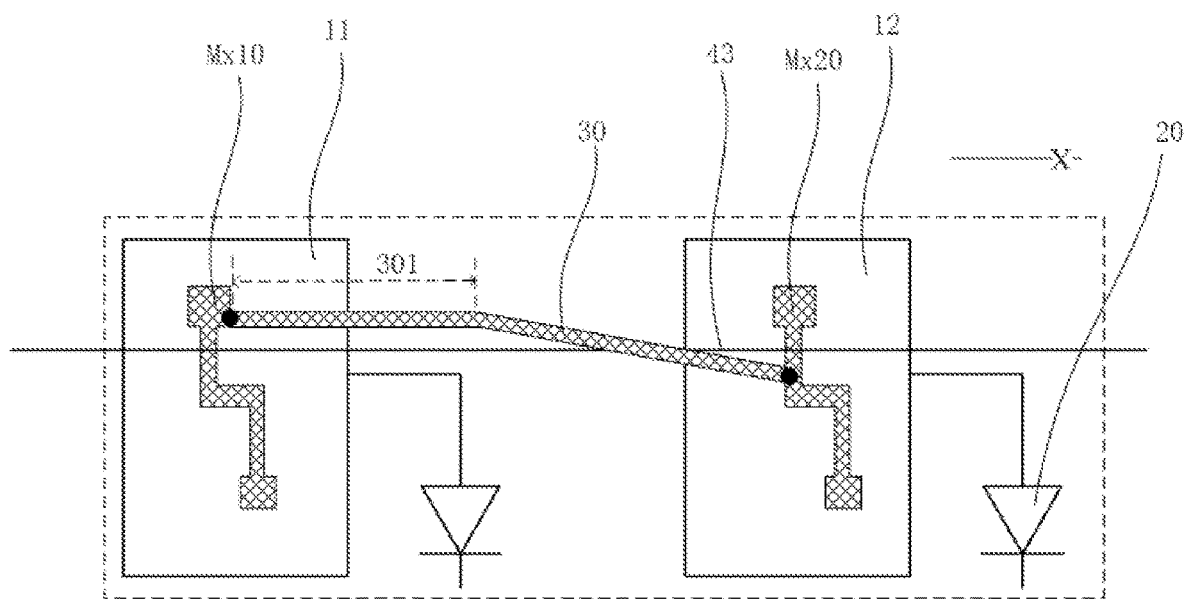
FIG. 13 illustrates a schematic structural diagram of another display panel consistent with the disclosed embodiments of the present disclosure.

FIG. 13 illustrates a schematic structural diagram of another display panel consistent with the disclosed embodiments of the present disclosure. As shown in FIG. 13, in one embodiment, the first pixel circuit 11 and the second pixel circuit 12 are arranged along the first direction X, and at least a portion of the first connection wire 30 is a curve or a polyline. The first connection wire 30 includes a first sub-connection wire 301, and the first sub-connection wire 301 extends along the first direction X. The display panel includes a signal line 43 that provides a control signal or an input signal for the pixel circuit 10 and extends along the first direction X. There is no overlap between the first sub-connection wire 301 and the signal line 43. In the display panel, the first connection wire 30 may be set to have a polyline or a curve shape, such that the overlap area between the first connection wire 30 and the signal line 43 may be minimized by optimization. For example, the first sub-connection wire 301 and the signal line 43 have a same extension direction, and another portion of the first connection wire may overlap with the signal line 43. Accordingly, the overlap area between the first connection wire 30 and the signal line 43 may be small, and the parasitic capacitance generated between the first connection wire 30 and the signal line 43 may be small.

Figure 14:
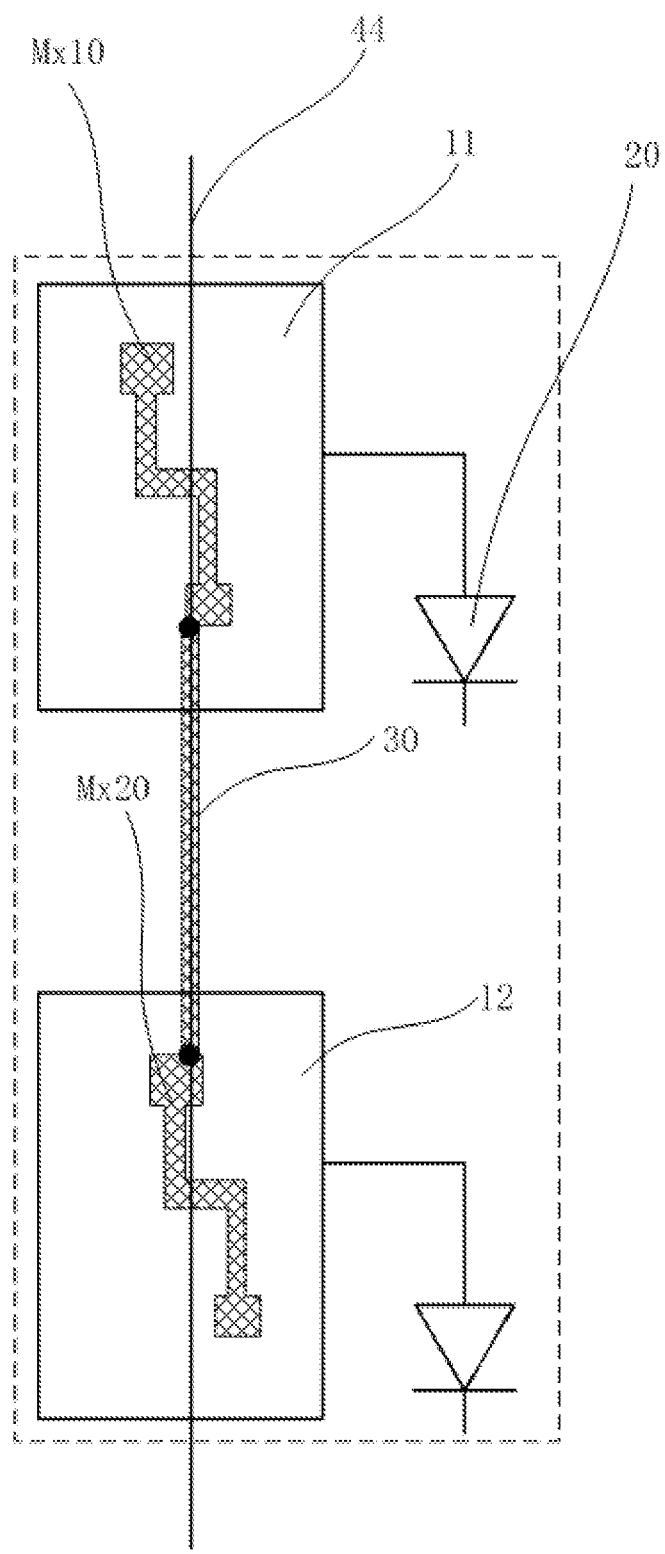
FIG. 14 illustrates a schematic structural diagram of another display panel consistent with the disclosed embodiments of the present disclosure.

FIG. 14 illustrates a schematic structural diagram of another display panel consistent with the disclosed embodiments of the present disclosure. As shown in FIG. 14, in one embodiment, the first pixel circuit 11 and the second pixel circuit 12 are arranged along a first direction X. The display panel also includes an initialization signal line 44 extending along the first direction X. The initialization signal line 44 is configured for providing the initialization signal for the initialization transistor. The initialization signal line 44 and the first connection wire 30 at least partially overlap. The initialization signal line 44 and the first connection wire 30 are each configured to transmit the initialization signal. Setting the initialization signal line 44 and the first connection wire 30 overlapped is equivalent to paralleling a line that transmits a same signal to the initialization signal line. Accordingly, the space of the panel may be saved, the voltage drop on the initialization signal line 44 may be reduced, and high stability of the transmission signal may be achieved.

Figure 15:
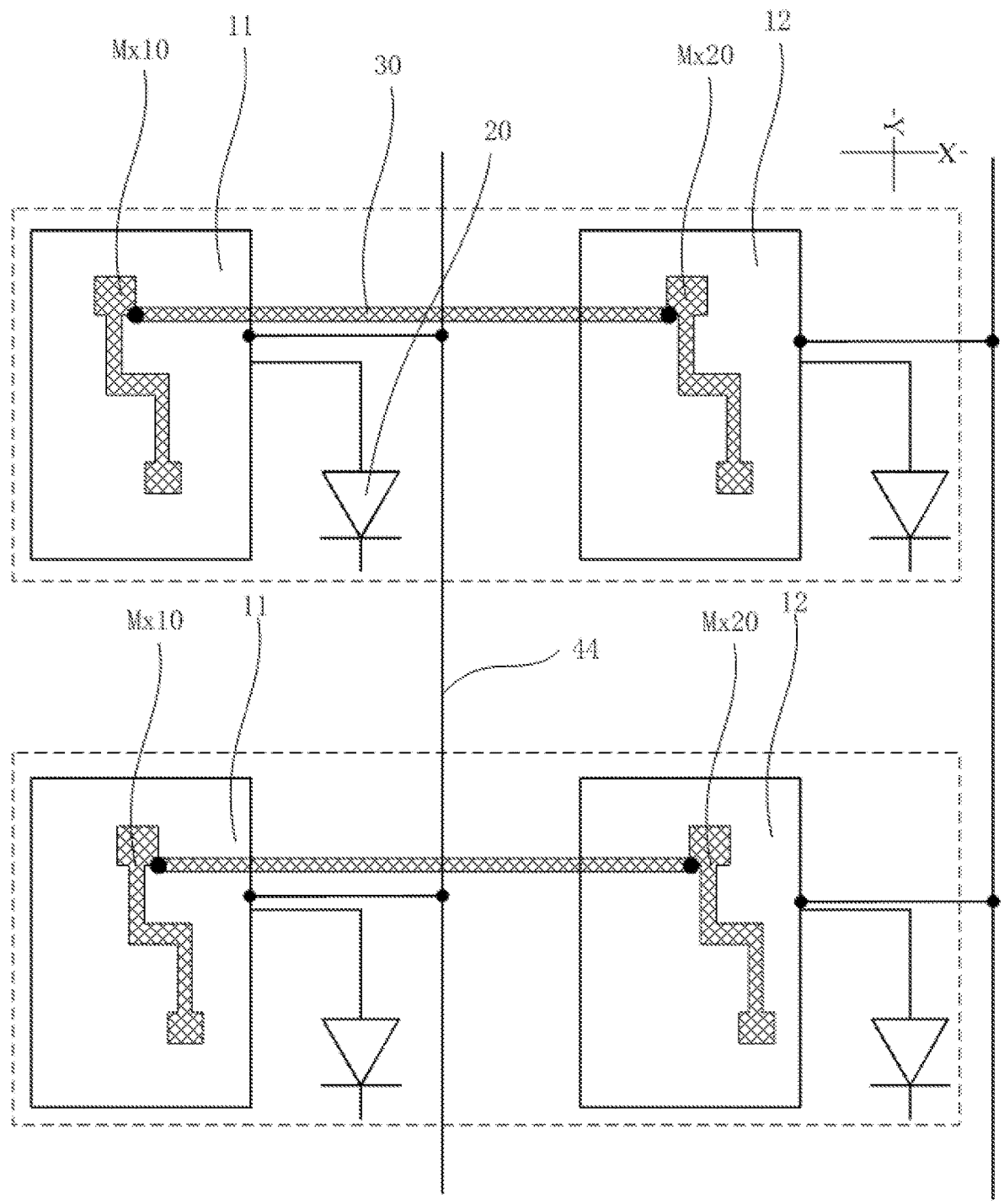
FIG. 15 illustrates a schematic structural diagram of another display panel consistent with the disclosed embodiments of the present disclosure.

FIG. 15 illustrates a schematic structural diagram of another display panel consistent with the disclosed embodiments of the present disclosure. As shown in FIG. 15, in one embodiment, the first pixel circuit 11 and the second pixel circuit 12 are arranged along the first direction X. The first connection wire 30 extends along the first direction X. The display panel also includes an initialization signal line 44 extending along a second direction Y for providing an initialization signal for the initialization transistor. The first direction X and the second direction Y intersect. The pixel circuits may be arranged in a multi-row*multi-column array. The first direction X may be an extension direction of a pixel circuit row (that is, an arrangement direction of multiple pixel circuit columns), and the second direction Y may be an extension direction of a pixel circuit column. The active layers of the initialization transistors in the pixel circuits 10 in the first direction X are connected through the first connection wire 30. The initialization transistors in the pixel circuits 10 in the second direction Y are connected to the initialization signal line 44. Thus, the active layers of the initialization transistors may be formed into a connected grid through the first connection wire 30 and the initialization signal line 44. When the initialization signal line 44 provides an initialization signal, the initialization signal may be transmitted in the first direction X and the second direction Y. Accordingly, consistency of the initialization signal received throughout the display panel may be improved.

In one embodiment, as shown in FIG. 3, the preset node Q may be the gate of the driving transistor T0. The driving transistor T0 may be a PMOS transistor. There is no overlap between the first connection wire 30 and the active layer of the silicon transistor SiTFT in the pixel circuit 10. Specifically, the silicon transistor SiTFT is generally a PMOS type transistor. When the driving transistor T0 is a PMOS type transistor, the initialization signal is a low-level signal, and an initialization process is performed on the driving transistor T0. At this time, the low-level signal is transmitted on the first connection wire 30. When the first connection wire 30 overlaps the active layer of the PMOS silicon transistor SiTFT, the PMOS silicon transistor SiTFT, which is originally in an off state, may be turned on, and the normal operation of the circuit may be affected.

Alternatively, the driving transistor T0 may be an NMOS transistor, and there is no overlap between the first connection wire 30 and the active layer of the oxide semiconductor transistor IGZO in the pixel circuit 10. Specifically, the oxide semiconductor transistor IGZO is generally an NMOS transistor. When the driving transistor T0 is an NMOS transistor, the initialization signal is a high-level signal, and an initialization process is performed on the driving transistor T0. At this time, the high-level signal is transmitted on the first connection wire 30. When the first connection wire 30 overlaps the active layer of the NMOS-type oxide semiconductor transistor IGZO, the NMOS-type oxide semiconductor transistor IGZO, which is originally in an off state, may be turned on, and the normal operation of the circuit may be affected.

In one embodiment, as shown in FIG. 4, the preset node Q is the anode of the light-emitting element 20. There is no overlap between the first connection wire 30 and the active layer of the silicon transistor SiTFT in the pixel circuit 10. Specifically, the initialization signal for the anode of the light-emitting element 20 is a low-level signal. At this time, the low-level signal is transmitted on the first connection wire 30. When the first connection wire 30 overlaps the active layer of the PMOS silicon transistor SiTFT, the PMOS silicon transistor SiTFT, which is originally in an off state, may be turned on, and the normal operation of the circuit may be affected.

Figure 16:
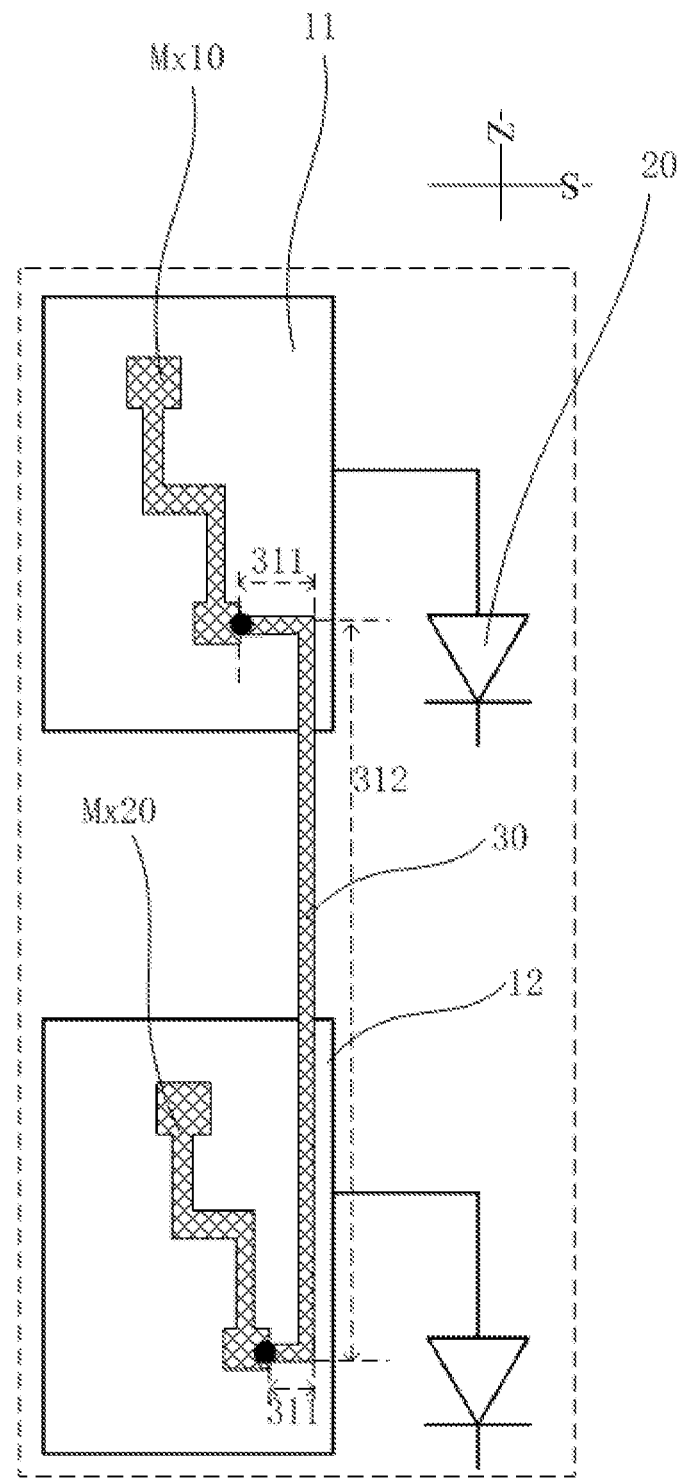
FIG. 16 illustrates a schematic structural diagram of another display panel consistent with the disclosed embodiments of the present disclosure.

FIG. 16 illustrates a schematic structural diagram of another display panel consistent with the disclosed embodiments of the present disclosure. As shown in FIG. 16, in one embodiment, the initialization transistors may have a fixed connection position. Portions 311 where the active layer Mx10 of the first initialization transistor and the active layer Mx20 of the second initialization transistor are connected to the first connection wire 30 extend along a third direction S. A remaining portion 312 of the first connection wire 30 extends along a fourth direction Z, where the third direction S intersects the fourth direction Z. Thus, the first connection wire 30 and the active layer may not extend in a same direction, and the first connection wire 30 may not cover the active layer. Accordingly, additional parasitic capacitance may be avoided, and connection between the active layer and the first connection wire 30 may be improved.

Figure 17:
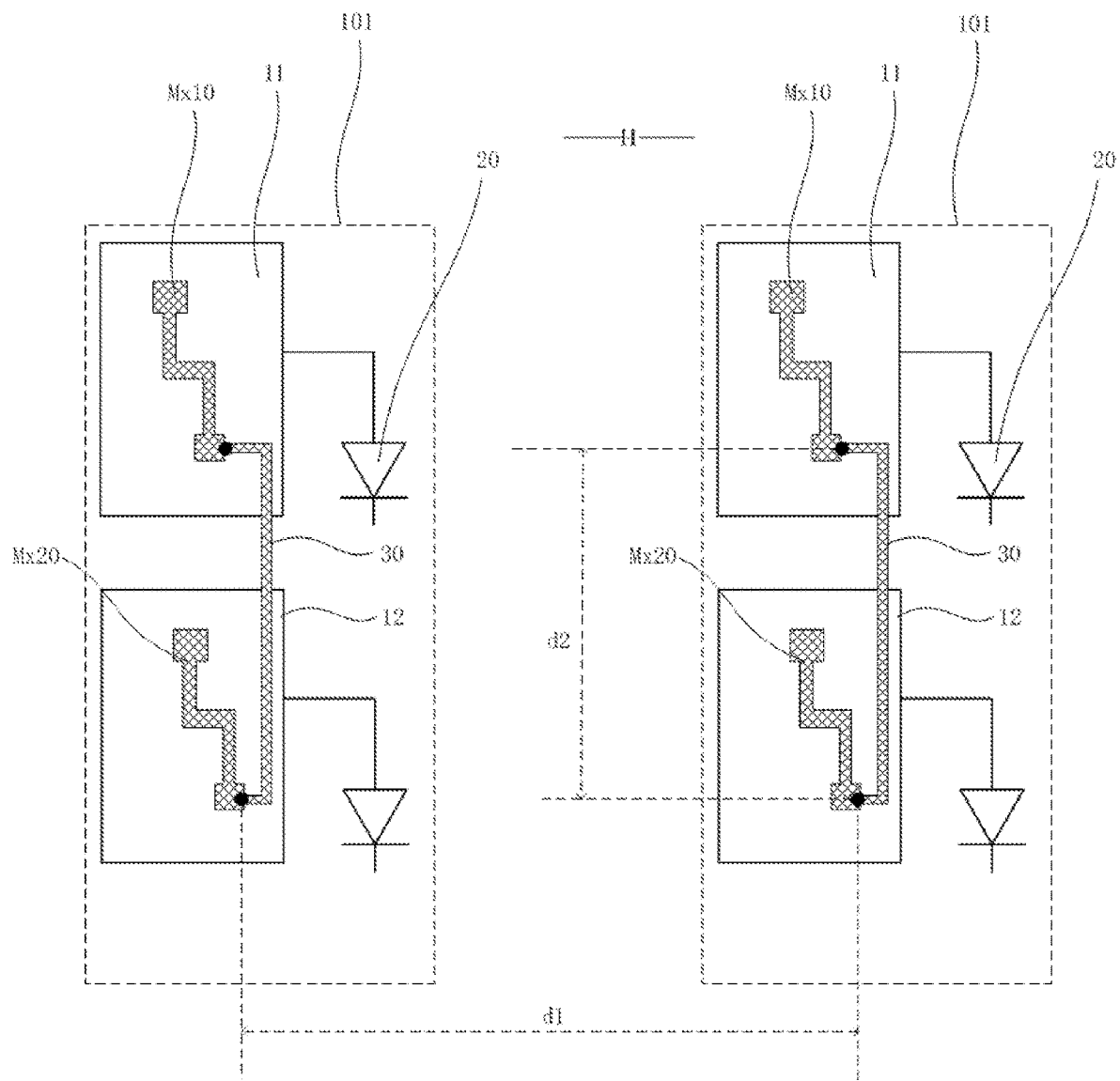
FIG. 17 illustrates a schematic structural diagram of another display panel consistent with the disclosed embodiments of the present disclosure.

FIG. 17 illustrates a schematic structural diagram of another display panel consistent with the disclosed embodiments of the present disclosure. As shown in FIG. 17, in one embodiment, the pixel circuits 10 includes pixel-circuit groups 101 repeatedly arranged along a fifth direction H. The pixel-circuit group 101 includes the first pixel circuit 11 and the second pixel circuit 12 arranged adjacently. Along the fifth direction H, a distance d1 between the active layers of the initialization transistors of two adjacent pixel-circuit groups 101 is greater than a distance d2 between the active layers of the initialization transistors of the first pixel circuit 11 and the second pixel circuit 12 in the pixel-circuit group 101. The active layers of the initialization transistors of the pixel circuits in two adjacent pixel-circuit groups 101 are not connected by the first connection wire 30.

Figure 18:
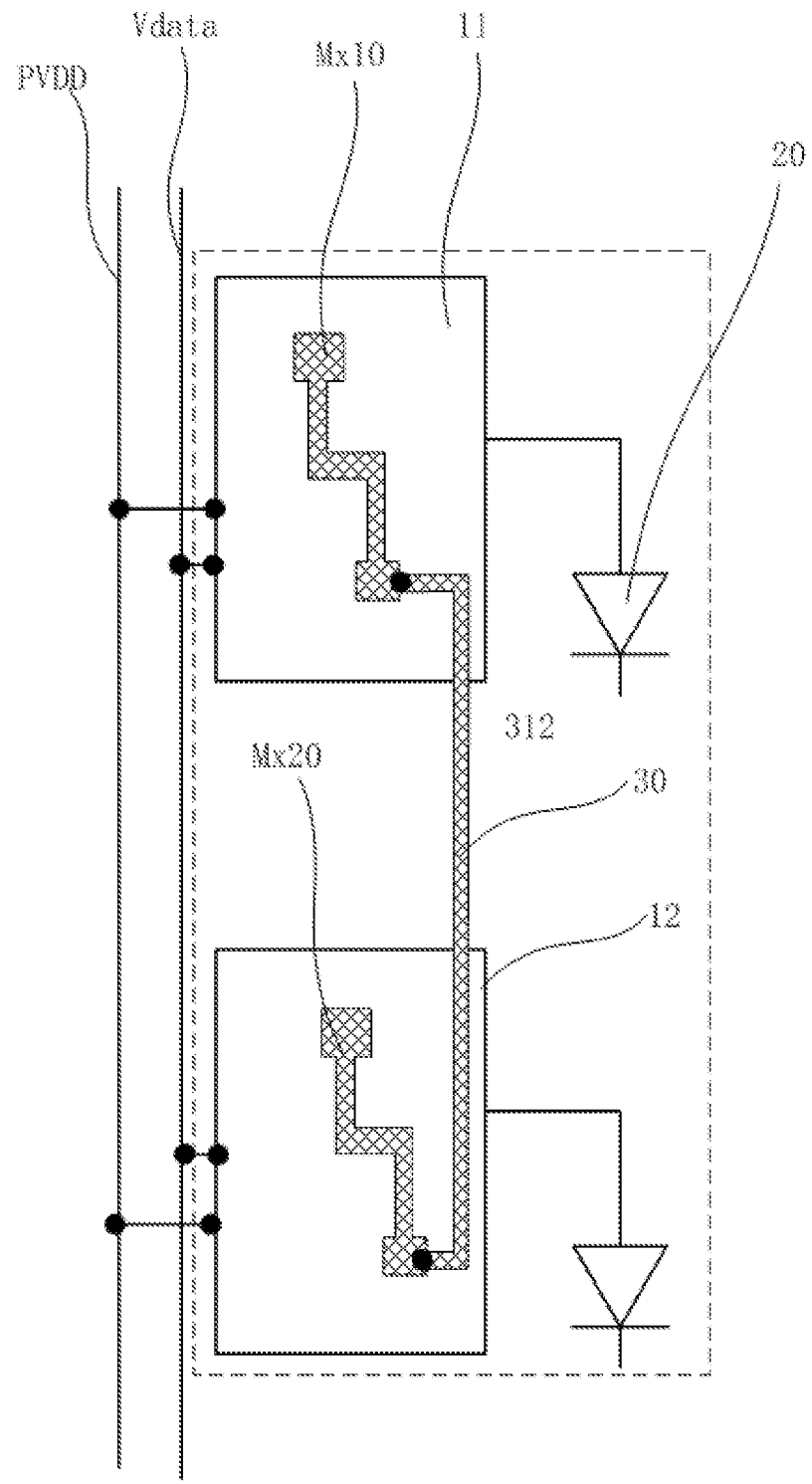
FIG. 18 illustrates a schematic structural diagram of another display panel consistent with the disclosed embodiments of the present disclosure.

FIG. 18 illustrates a schematic structural diagram of another display panel consistent with the disclosed embodiments of the present disclosure. As shown in FIG. 18, in one embodiment, the display panel includes a first voltage signal line and a data signal line. The first voltage signal line is configured to provide the pixel circuit 10 with a first voltage signal PVDD. The data signal line is configured to provide the pixel circuit 10 with a data signal Vdata. The first connection wire 30, the first voltage signal line, and the data signal line extend in a same direction. There is no overlap between any two of the first connection wire 30, the first voltage signal line and the data signal line.

It may be understood that, when there is no overlap between any two of the first connection wire 30, the first voltage signal line and the data signal line, parasitic capacitance between any two of the first connection wire, the first voltage signal line and the data signal line may be avoided. Accordingly, stability of the signal transmission of each line may be improved.

In one embodiment, an overlap area S1 between the first connection wire and the first voltage signal line is greater than an overlap area S2 between the first connection wire and the data signal line, with S≥0. The signal PVDD transmitted by the first voltage signal line may be a fixed potential signal and is relatively stable, while the signal Vdata transmitted by the data signal line may be changing. The parasitic capacitance generated by the overlap between the first connection wire and the data signal line may cause interference, affect the transmission of the data signal line, and affect the stability of the signal Vdata that determines the magnitude of the driving current. Accordingly, the overlap area between the first connection wire and the first voltage signal line may be designed to be larger than the overlap area between the first connection wire and the data signal line.

Figure 19:
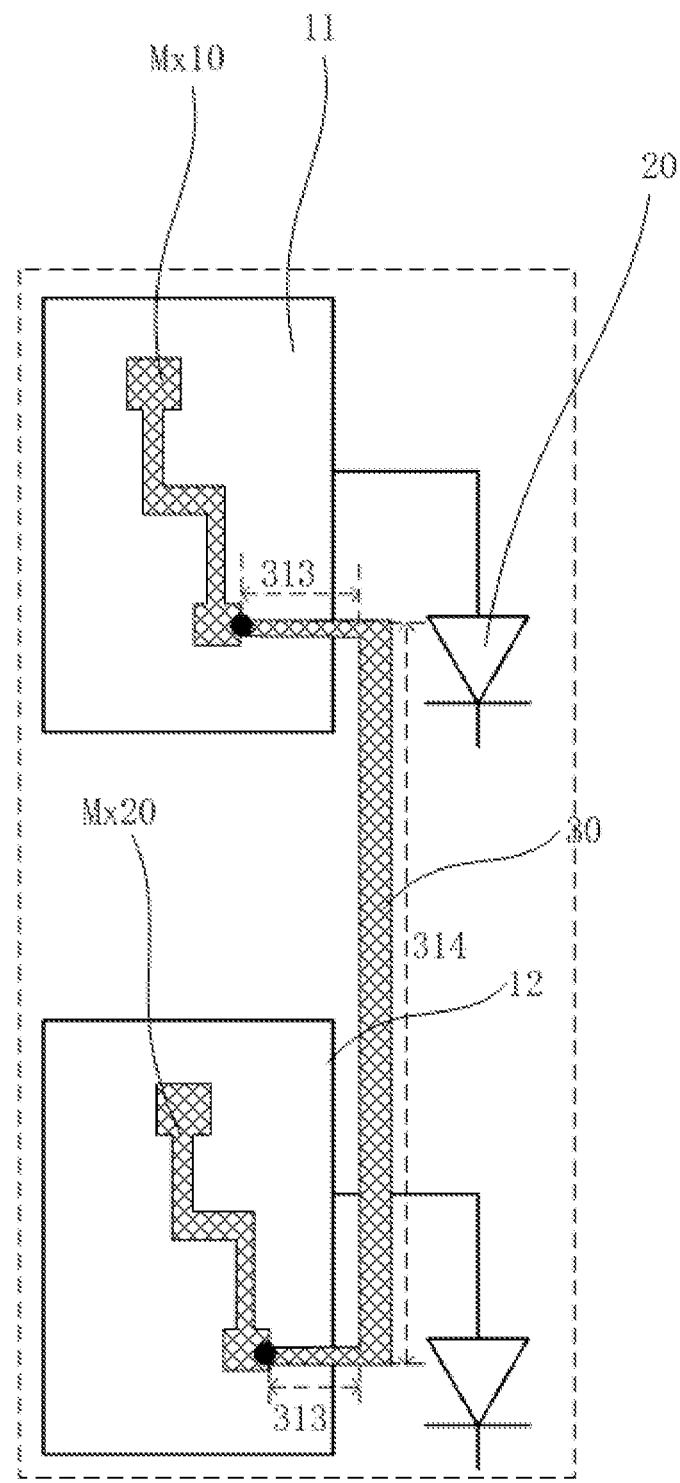
FIG. 19 illustrates a schematic structural diagram of another display panel consistent with the disclosed embodiments of the present disclosure.

FIG. 19 illustrates a schematic structural diagram of another display panel consistent with the disclosed embodiments of the present disclosure. As shown in FIG. 19, in one embodiment, the first connection wire 30 includes a first sub-wire 313 and a second sub-wire 314. The first sub-wire 313 is directly connected to the active layer Mx10 of the first initialization transistor. The first sub-wire 313 also includes a portion connected to the active layer Mx20 of the second initialization transistor. The second sub-wire 314 is located on a side of the first sub-wire 313 away from the active layer Mx10 of the first initialization transistor. A width of the second sub-wire 314 may be greater than a width of the first sub-wire 313. In the present disclosure, by setting the width of the second sub-wire 314 to be greater than the width of the first sub-wire 313, the impedance of the first connection wire 30 may be decreased, and an additional increase of an area of the pixel circuit 10 may be avoided.

Figure 20:
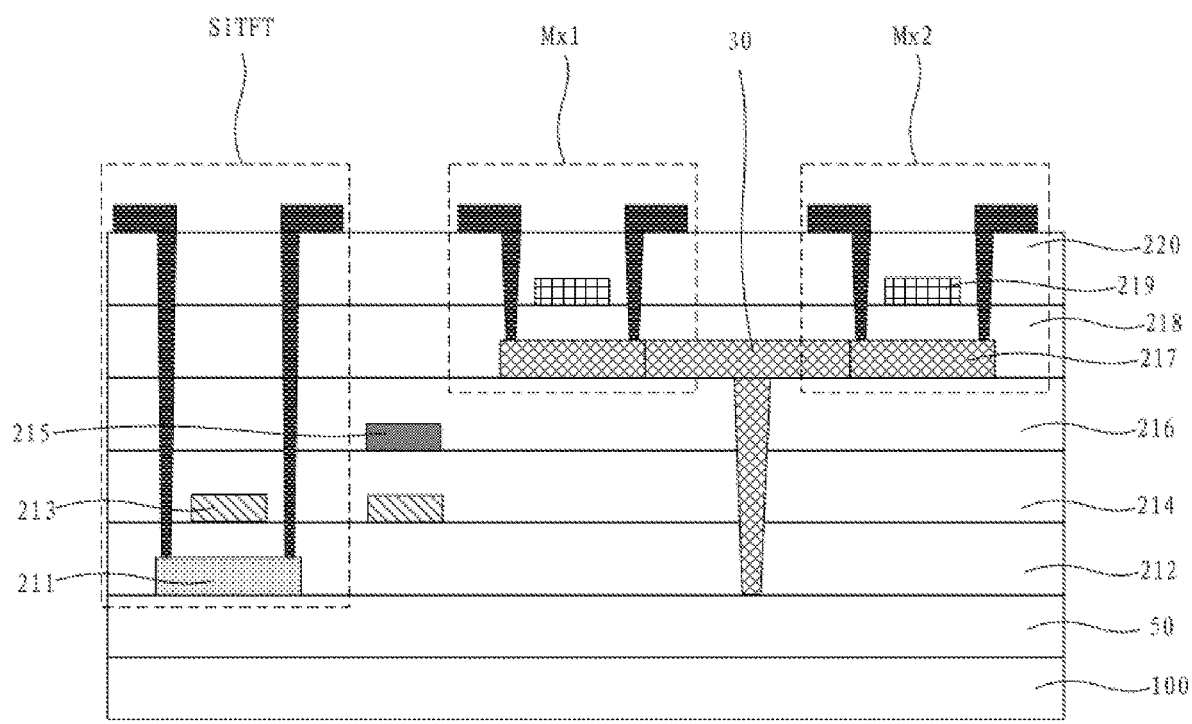
FIG. 20 illustrates a schematic structural diagram of another display panel consistent with the disclosed embodiments of the present disclosure.

FIG. 20 illustrates a schematic structural diagram of another display panel consistent with the disclosed embodiments of the present disclosure. As shown in FIG. 20, in one embodiment, the pixel circuit also includes a first conductive layer 50. The first conductive layer 50 is located on a side of the active layer of the silicon transistor SiTFT facing the base substrate 100 of the display panel. The first connection wire 30 and the first conductive layer 50 are connected to each other. In one embodiment, the first conductive layer 50 is disposed under the active layer of the silicon transistor SiTFT. A fixed signal may be applied to the first conductive layer 50, and the stability of the silicon transistor SiTFT may thus be improved. The first connection wire 30 may be connected to the first conductive layer 50 to transmit an initialization signal with a fixed potential to the first conductive layer 50, and a separate wire for transmitting signals to the first conductive layer 50 may be avoided. In particular, when the separate wire for transmitting signals to the first conductive layer 50 is a metal wire, the transmittance of the display panel may be affected.

Figure 21:
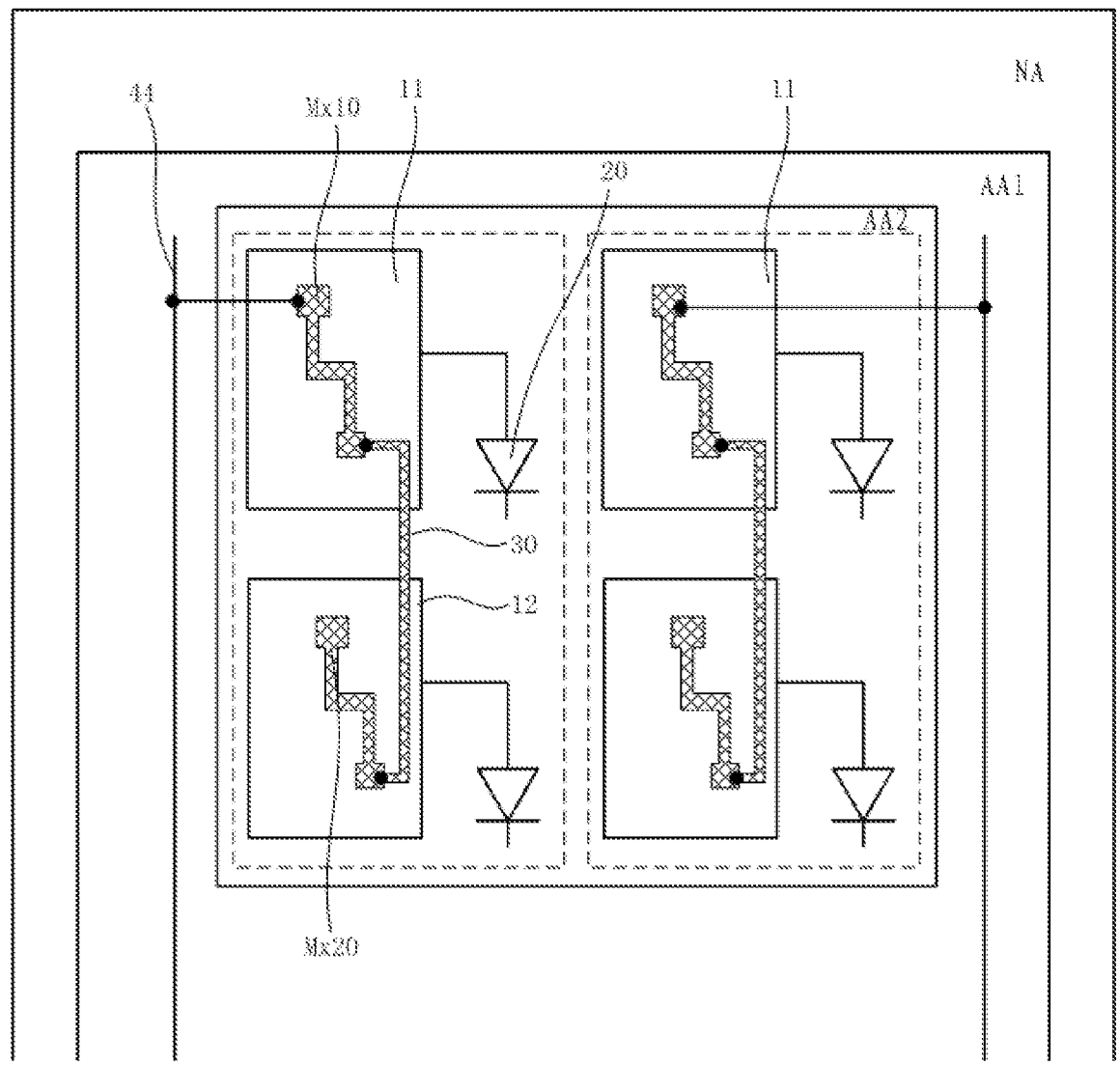
FIG. 21 illustrates a schematic structural diagram of another display panel consistent with the disclosed embodiments of the present disclosure.

FIG. 21 illustrates a schematic structural diagram of another display panel consistent with the disclosed embodiments of the present disclosure. As shown in FIG. 21, in one embodiment, the display panel includes a first display area AA1 and a second display area AA2. The second display area AA2 is disposed with a camera element or a light-sensitive fingerprint recognition element. The first pixel circuit 11 and the second pixel circuit 12 are located in the second display area AA2. The display panel includes an under-screen camera area or an under-screen fingerprint recognition area. Since an area of the display panel corresponding to the under-screen camera area or the under-screen fingerprint recognition area needs to have a larger transmittance, a quantity of wires may need to be reduced. In one embodiment, a transparent first connection wire may be disposed to replace an existing signal line for transmitting an initialization signal to increase the transmittance of the area of the display panel corresponding to the under-screen camera area or the under-screen fingerprint recognition area.

As shown in FIG. 21, the first display area AA1 includes an initialization signal line 44 that provides an initialization signal for the initialization transistor. The initialization signal line 44 is connected to the active layer Mx10 of the first initialization transistor. The active layer Mx10 of the first initialization transistor is connected to the active layer Mx20 of the second initialization transistor through the first connection wire 30.

The present disclosure also provides a display device, including a display panel provided by the present disclosure.

Figure 22:
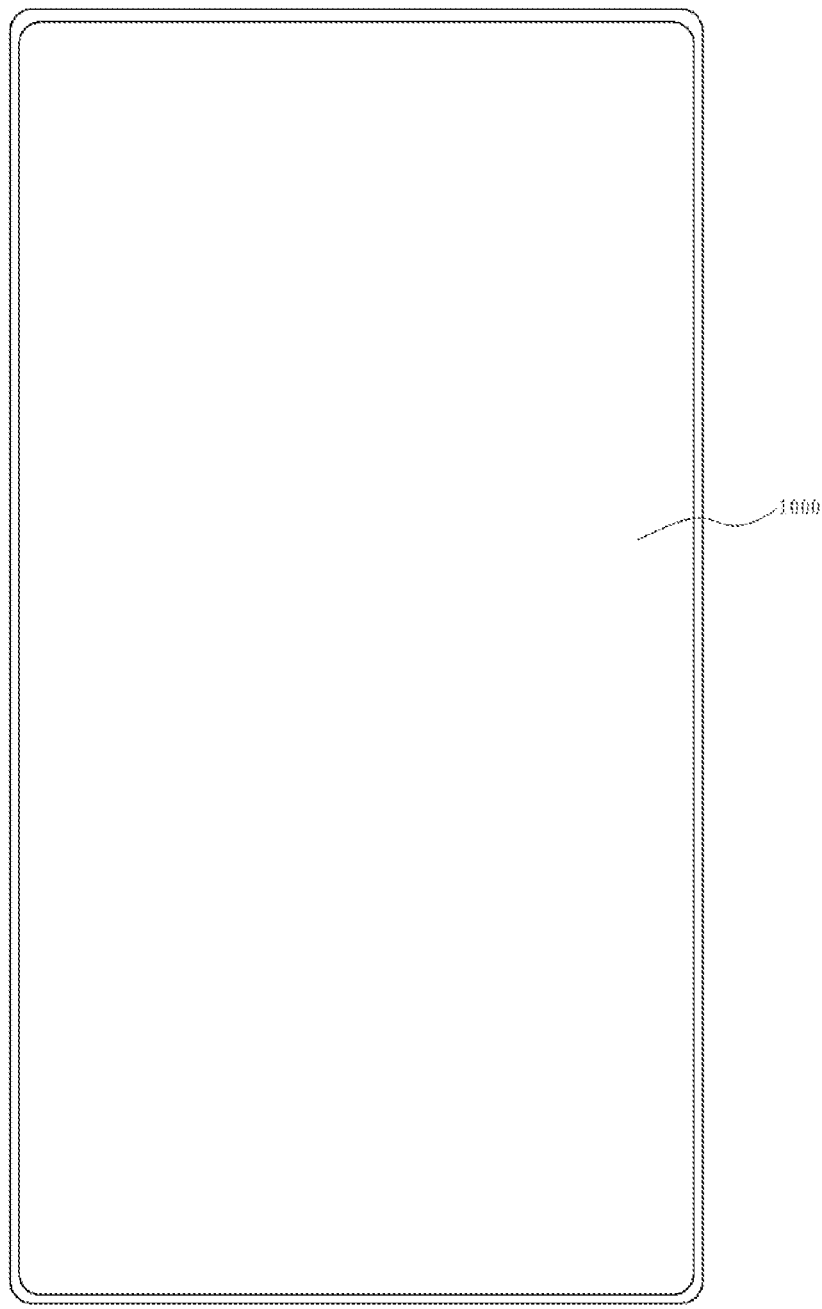
FIG. 22 illustrates a schematic structural diagram of a display device consistent with the disclosed embodiments of the present disclosure.

FIG. 22 illustrates a schematic structural diagram of a display device consistent with the disclosed embodiments of the present disclosure. As shown in FIG. 22, in one embodiment, the display device 1000 may be a mobile terminal device.

In some other embodiments, the display device may also be an electronic display device such as a mobile phone, a computer, a vehicle-mounted terminal, etc., and is not specifically limited by the present disclosure.

As disclosed, the technical solutions of the present disclosure have the following advantages.

The present disclosure provides a display panel and a display device. The active layer of the first initialization transistor of the first pixel circuit is connected to the active layer of the second initialization transistor of the second pixel circuit through the first connection wire, such that the active layers of the initialization transistors in different areas are connected. Thus, after one of the initialization transistors is connected to an initialization signal, the initialization signal may be transmitted to another initialization transistor through the first connection wire. Accordingly, large differences in the initialization signals of the initialization transistors in different regions, when the initialization signals are only transmitted through the signal lines with voltage drops, may be avoided. As such, uniformity of the initialization signals connected to the initialization transistors in different areas of the display panel may be improved.

In addition, by connecting the active layer of the first initialization transistor to the active layer of the second initialization transistor through the first connection wire, a quantity of the signal lines for transmitting the initialization signals may be reduced. Accordingly, a line density of the display panel may be reduced, and thus a purpose of resolution improvement may be achieved. Further, when one of the signal lines for transmitting the initialization signals is disconnected, the initialization signals may be transmitted to the connected initialization transistors through the first connection wire. Accordingly, circuit flexibility and reliability may be improved.

Moreover, in the present disclosure, at least a portion of the area of the first connection wire and the active layer of the oxide semiconductor transistor are located on a same layer. By adjusting the electrical conductivity of the first connection wire, the first connection wire may be used as a wire for connecting two active layers, and a conductive film for making the first connection wire may not need to be separately prepared. Accordingly, a process flow for preparing the display panel may be simplified, and complexity of wiring layouts of other conductive film layers may be decreased.

The embodiments disclosed herein are exemplary only and not limiting the scope of this disclosure. Various combinations, alternations, modifications, equivalents, or improvements to the technical solutions of the disclosed embodiments can be obvious to those skilled in the art. Without departing from the spirit and scope of this disclosure, such combinations, alternations, modifications, equivalents, or improvements to the disclosed embodiments are intended to be encompassed within the scope of the present disclosure.

What is claimed is:

1. A display panel, comprising:
a pixel circuit; and
a plurality of light-emitting elements,
wherein:
the pixel circuit includes a driving transistor and an initialization transistor, wherein the initialization transistor is configured to provide an initialization signal for a preset node, and the preset node is a gate of the driving transistor, or an anode of a light-emitting element;
the pixel circuit includes an oxide semiconductor transistor and a silicon transistor, wherein an active layer of the oxide semiconductor transistor includes an oxide semiconductor, and an active layer of the silicon transistor includes silicon;
the pixel circuit includes a first pixel circuit and a second pixel circuit, wherein the first pixel circuit includes a first initialization transistor, the second pixel circuit includes a second initialization transistor, and the first pixel circuit and the second pixel circuit are connected to different light-emitting elements;
an active layer of the first initialization transistor is directly connected to an active layer of the second initialization transistor through a first connection wire, and at least a portion of the first connection wire and the active layer of the oxide semiconductor transistor are located on a same layer;
the first pixel circuit and the second pixel circuit are arranged along a first direction;

the first connection wire extends from the active layer of the first initialization transistor along the first direction to the active layer of the second initialization transistor; and the display panel further includes a first signal line extending along the first direction, wherein the first signal line transmits an initialization signal for the pixel circuit.

2. The display panel according to claim 1, wherein:
the first connection wire includes a first oxide semiconductor, and the active layer of the initialization transistor includes a second oxide semiconductor; and
an electrical conductivity of the first connection wire is greater than an electrical conductivity of a channel region of the active layer of the initialization transistor.

3. The display panel according to claim 1, wherein:
the first signal line and the first connection wire do not overlap.

4. The display panel according to claim 1, wherein:
the pixel circuit further includes a third pixel circuit, and the third pixel circuit includes a third initialization transistor;
the first pixel circuit and the third pixel circuit are arranged along a second direction, and the first direction and the second direction intersect;
the active layer of the first initialization transistor and an active layer of the third initialization transistor are connected through a second connection wire extending in the second direction; and
at least a portion of the second connection wire and an active layer of at least one of the first initialization transistor and the third initialization transistor are located on a same layer.

5. The display panel according to claim 4, further comprising an integrated chip, wherein:
the integrated chip is located on a side frame of a display area of the display panel;
the integrated chip provides the initialization signal for the pixel circuit; and
a width of the second connection wire is greater than a width of the first connection wire.

6. The display panel according to claim 4, further comprising a second signal line extending along the second direction, wherein:
the second signal line provides a control signal or an input signal for the pixel circuit; and
the second connection wire and the second signal line do not overlap.

7. The display panel according to claim 1, further comprising a signal line, wherein:
the signal line provides a control signal or an input signal for the pixel circuit, and the signal line extends along the first direction;
the first pixel circuit and the second pixel circuit are arranged along the first direction, and at least a portion of the first connection wire is a curve line or a polyline;
the first connection wire includes a first sub-connection wire, and the first sub-connection wire extends along the first direction; and
the first sub-connection wire and the signal line do not overlap.

8. The display panel according to claim 1, further comprising an initialization signal line, wherein:
the first pixel circuit and the second pixel circuit are arranged along a first direction;
the initialization signal line extends along the first direction;
the initialization signal line is configured to provide the initialization signal for the initialization transistor; and
the initialization signal line and the first connection wire at least partially overlap.

9. The display panel according to claim 1, further comprising an initialization signal line, wherein:
the first pixel circuit and the second pixel circuit are arranged along the first direction, and the first connection wire extends along the first direction;
the initialization signal line extends along a second direction, and the initialization signal line is configured to provide an initialization signal for the initialization transistor; and
the first direction and the second direction intersect.

10. The display panel according to claim 1, wherein:
the preset node is the gate of the driving transistor, wherein:
the driving transistor is a P-type transistor, and the first connection wire and the active layer of the silicon transistor in the pixel circuit do not overlap; or
the driving transistor is an N-type transistor, and the first connection wire and the active layer of the oxide semiconductor transistor in the pixel circuit do not overlap.

11. The display panel according to claim 1, wherein:
the preset node is an anode of the light-emitting element; and
the first connection wire and the active layer of the silicon transistor in the pixel circuit do not overlap.

12. The display panel according to claim 1, wherein:
portions of the active layers of the first initialization transistor and the second initialization transistor connected to the first connection wire extend along a third direction; and
the first connection wire extends along a fourth direction, wherein the third direction and the fourth direction intersect.

13. The display panel according to claim 1, wherein:
the pixel circuits include pixel-circuit groups repeatedly arranged along a fifth direction, and at least one pixel-circuit group of the pixel-circuit groups includes the first pixel circuit and the second pixel circuit arranged adjacent to each other;
a distance between active layers of initialization transistors of two adjacent pixel-circuit groups is greater than a distance between the active layers of the initialization transistors of the first pixel circuit and the second pixel circuit in the pixel-circuit group; and
the active layers of the initialization transistors of the pixel circuits in two adjacent pixel-circuit groups are not connected through the first connection wire.

14. The display panel according to claim 1, further comprising a first voltage signal line and a data signal line, wherein:
the first voltage signal line is configured to provide the pixel circuit with a first voltage signal; and
the data signal line is configured to provide the pixel circuit with a data signal,
wherein
the first connection wire, the first voltage signal line, and the data signal line extend in a same direction, and
any two of the first connection wire, the first voltage signal line, and the data signal line do not overlap; or
an overlap area S1 between the first connection wire and the first voltage signal line is greater than an overlap area S2 between the first connection wire and the data signal line, wherein $S2 \geq 0$.

15. The display panel according to claim 1, wherein:
the first connection wire includes a first sub-wire and a second sub-wire;
the first sub-wire is directly connected to the active layer of the first initialization transistor;
the second sub-wire is located on a side of the first sub-wire away from the active layer of the first initialization transistor; and
a width of the second sub-wire is greater than a width of the first sub-wire.

16. The display panel according to claim 1, wherein:
the pixel circuit further includes a first conductive layer;
the first conductive layer is located on a side of the active layer of the silicon transistor facing a base substrate of the display panel; and
the first connection wire and the first conductive layer are connected to each other.

17. The display panel according to claim 1, further comprising a first display area and a second display area, wherein:
the first pixel circuit and the second pixel circuit are located in the second display area;
the first display area includes an initialization signal line, and the initialization signal line provides an initialization signal for the initialization transistor;
the initialization signal line is connected to the active layer of the first initialization transistor; and
the active layer of the first initialization transistor is connected to the active layer of the second initialization transistor through the first connection wire.

18. The display panel according to claim 1, wherein:
the preset node of the first pixel circuit and the preset node of the second pixel circuit are a gate of a corresponding driving transistor; and/or
the preset node of the first pixel circuit and the preset node of second pixel circuit are an anode of a corresponding light-emitting element.

19. A display device, comprising a display panel, wherein the display panel includes:
a pixel circuit; and
a plurality of light-emitting elements,
wherein:
the pixel circuit includes a driving transistor and an initialization transistor, wherein the initialization transistor is configured to provide an initialization signal for a preset node, and the preset node is a gate of the driving transistor, or an anode of a light-emitting element;
the pixel circuit includes an oxide semiconductor transistor and a silicon transistor, wherein an active layer of the oxide semiconductor transistor includes an oxide semiconductor, and an active layer of the silicon transistor includes silicon;
the pixel circuit includes a first pixel circuit and a second pixel circuit, wherein the first pixel circuit includes a first initialization transistor, the second pixel circuit includes a second initialization transistor, and the first pixel circuit and the second pixel circuit are connected to different light-emitting elements;
an active layer of the first initialization transistor is directly connected to an active layer of the second initialization transistor through a first connection wire, and at least a portion of the first connection wire and the active layer of the oxide semiconductor transistor are located on a same layer;
the first pixel circuit and the second pixel circuit are arranged along a first direction;
the first connection wire extends from the active layer of the first initialization transistor along the first direction to the active layer of the second initialization transistor; and
the display panel further includes a first signal line extending along the first direction, wherein the first signal line transmits an initialization signal for the pixel circuit.

* * * * *